US012529712B2

(12) United States Patent
Carpintero Del Barrio et al.

(10) Patent No.: US 12,529,712 B2
(45) Date of Patent: Jan. 20, 2026

(54) ULTRA-WIDEBAND INTERCONNECTION PROBES

(71) Applicant: UNIVERSIDAD CARLOS III DE MADRID, Getafe (ES)

(72) Inventors: Guillermo Carpintero Del Barrio, Getafe (ES); Alejandro Rivera Lavado, Getafe (ES); Luis Enrique García Muñoz, Getafe (ES); Muhsin Ali, Getafe (ES)

(73) Assignee: UNIVERSIDAD CARLOS III DE MADRID, Getafe (ES)

(*) Notice: Subject to any disclaimer, the term of this patent is extended or adjusted under 35 U.S.C. 154(b) by 292 days.

(21) Appl. No.: 18/252,004

(22) PCT Filed: Nov. 4, 2021

(86) PCT No.: PCT/EP2021/080652
§ 371 (c)(1),
(2) Date: May 5, 2023

(87) PCT Pub. No.: WO2022/096578
PCT Pub. Date: May 12, 2022

(65) Prior Publication Data

US 2024/0012024 A1 Jan. 11, 2024

(30) Foreign Application Priority Data

Nov. 5, 2020 (EP) .................................... 20382960

(51) Int. Cl.
*G01R 1/067* (2006.01)
*H01P 3/16* (2006.01)

(52) U.S. Cl.
CPC ............ *G01R 1/06772* (2013.01); *H01P 3/16* (2013.01)

(58) Field of Classification Search
CPC .............................. G01R 1/06772; H01P 3/16
(Continued)

(56) References Cited

U.S. PATENT DOCUMENTS 2,625,605 A * 1/1953 Chandler .................. H01P 7/00 343/785
2,760,162 A * 8/1956 Miller ....................... H01P 1/23 333/81 R (Continued)

FOREIGN PATENT DOCUMENTS

FR 2449977 A1 9/1980
FR 2451641 A1 10/1980

OTHER PUBLICATIONS

Dielectric Waveguide Tapered Optical Coupler (Year: 2004).*

(Continued)

*Primary Examiner* — Paresh Patel

(57) ABSTRACT

A ultra-wideband interconnection probe (100) connectable to a first access port of a first electronic device (101), the first access port comprising a first tapered coupler (101*a*) and to a second access port of a second electronic device (102), the second access port comprising a second tapered coupler (102*a*), the ultra-wideband interconnection probe (100) comprising a dielectric waveguide structure (120) establishing a high-pass characteristic interconnect, operating over a high frequency range starting from a low cut-off frequency $f_{CL}$ in the microwave range or in the millimeter-wave range, wherein the dielectric waveguide structure (120) comprises a first tapered end (120*a*) connectable to the first access port via the first tapered coupler (101*a*) and a second tapered end (120*b*) connectable to the second access port via the second tapered coupler (102*a*).

20 Claims, 19 Drawing Sheets

(58) Field of Classification Search
USPC ............................................................ 324/95
See application file for complete search history.

(56) References Cited

U.S. PATENT DOCUMENTS

| | | | | | |
|---|---|---|---|---|---|
| 2,867,776 | A | * | 1/1959 | Wilkinson, Jr. | H01P 5/087<br>333/240 |
| 3,411,112 | A | * | 11/1968 | Honig | H01P 5/087<br>333/24 R |
| 3,995,238 | A | * | 11/1976 | Knox | H01P 1/16<br>455/316 |
| 4,291,278 | A | | 9/1981 | Quine | |
| 4,412,192 | A | * | 10/1983 | Paolino | H01P 1/067<br>333/261 |
| 4,689,584 | A | * | 8/1987 | Sequeira | H01Q 13/20<br>333/1.1 |
| 4,732,401 | A | * | 3/1988 | Siemon | B62C 1/00<br>182/127 |
| 4,745,377 | A | * | 5/1988 | Stern | H01P 5/087<br>333/34 |
| 4,785,268 | A | * | 11/1988 | Walter | H01P 3/16<br>333/248 |
| 4,792,774 | A | * | 12/1988 | Walter | H01P 1/162<br>333/251 |
| 5,225,797 | A | * | 7/1993 | Schary | H01P 5/1022<br>333/128 |
| 2015/0008990 | A1 | * | 1/2015 | Chu | B29D 11/00663<br>333/239 |
| 2019/0011359 | A1 | | 1/2019 | Brown | |

OTHER PUBLICATIONS

International Search Report dated Jul. 12, 2021 for International Application No. PCT/EP2021/080652.
Tsai Wan-Ling et al., "Novel Broadband Transition for Rectangular Dielectric Waveguide to Planar Circuit Board at D Band", 2018 IEEE/MTT-S International Microwave Symposium—IMS, IEEE, Jun. 10, 2018, pp. 386-389, DOI: 10.1109/MWSYM.2018.8439847.
Ocket I Lja et al., "Millimeter wave planar transition from plastic rectangular waveguide to 1 mm coax", 2016 IEEE MTT-S International Microwave Symposium (IMS). IEEE, May 22, 2016, pp. 1-4, DOI: 10.1109/MWSYM.2016.7540251.
Jurgen Richter et al., "A Broadband Transition between Dielectric and Planar Waveguides at Millimeterwave Frequencies", European Microwave Conference, 2003. 33rd, IEEE, Piscataway, NJ, USA, Oct. 1, 2003, pp. 947-950.
Jiejin Wu et al., "Design of band-pass Filters at Ka-band with waveguideto microstriptransition", Antennas, Propagation and Em Theory, 2008. ISAPE 2008. 8th International Symposium on, IEEE, Piscataway, NJ, USA, Nov. 2, 2008, pp. 565-568, ISBN: 978-1-4244-2192-3.

* cited by examiner

200

| Name | X | Y |
|---|---|---|
| m1 | 2.5000 | -2.7716 |
| m2 | 11.0000 | -3.1180 |
| m3 | 22.0000 | -4.2371 |
| m4 | 28.2500 | -6.3508 |
| m5 | 5.0000 | -2.8783 |
| m6 | 17.5000 | -3.5267 |
| m7 | 31.0000 | -3.4732 |
| m8 | 24.0000 | -2.9010 |

ULTRA-WIDEBAND INTERCONNECTION PROBES

The present invention refers to an ultra-wideband interconnection probe structure for electronic signals which combines dielectric waveguide elements with metal waveguide elements, which can be fabricated on different material substrates. The interconnection structure that results from this combination provides an ultra-wide bandwidth, with an operating frequency range can start at 0 Hz (DC) and reach up into the Terahertz range (300 GHz to 3000 GHz) and above.

BACKGROUND OF THE INVENTION

To date, various interconnection standards for electrical signals have been defined, which used by the electronics industry in devices and instrumentation test equipment for device characterization as well as on a wide range of application fields, ranging from communication to spectroscopy-based sensor systems. A Vector Network Analyzer (VNA) is the main measurement platform for phase sensitive measurements in electronics. VNA's provide the only platform that has standardized calibration procedures accepted by industry to characterize the frequency response of electronic systems, from low frequency (few kHz) up into the millimeter-(MMW, 30 GHz to 300 GHz) and Terahertz (THz, 300 GHz to 3000 GHz) ranges. A VNA operates in the frequency domain, measuring the amplitude and phase of a signal interacting with an electronic device—both transmitted and reflected signals are measured simultaneously—, with the frequency being swept through the measurement band, providing frequency-dependent data. VNA systems are composed of a baseband unit (with a maximum frequency <67 GHz), fitted with standardized coaxial connectors. Through these connectors, using coaxial cables, one can connect frequency extension heads that enable to extend the maximum frequency to higher frequencies. While significant progress has been achieved in the fabrication of monolithic microwave integrated circuits (MMICs), there is a lack of new developments to push the limits of the current high-frequency electrical interconnects technology towards higher frequencies.

This lack is the cause of a limitation of VNAs broadband frequency extension heads, which use coaxial connector interfaces. In their more advanced versions cover a frequency range from 0 Hz (DC) to 133 GHz (using the 1 mm coaxial standard) or from Hz to 220 GHz (using the more advanced 0.6 mm coaxial standard). Aside from the cost of these connectors (over € 600 per unit for the 1 mm standard), one of the major problems is that coaxial connectors are reaching their physical limit with the 0.6 mm coaxial standard (the given dimension refers to the smallest inner diameter of the outer conductor). To further increase the maximum operating frequency, the coaxial connector must further reduce its size, which increases their fragility and has a direct impact on the number of contacts that can be made. More serious is the problem related to the repeatability of the measurements, even when qualified personnel perform these interconnects.

Another limitation appears when VNAs need to perform measurements at frequencies above the maximum frequency of the coaxial standards. The frequency extension heads that reach into the Terahertz frequency range rely on standardized rectangular metal waveguide interconnects, which define different waveguide flange sizes that introduce important limitations. The interconnects between two flanges must be as close to perfect as possible since at such short wavelengths, as any skew in a flange connection can cause unwanted reflections that will degrade signal quality and reduce signal power. This is more critical at THz, due to the smaller dimensions required. In the same way as coaxial connectors, the higher the frequency the smaller the size of the waveguides. This is also bringing rectangular metal waveguides beyond the current state of the art of routine industrial manufacturing. However, the most important limitation of rectangular metal waveguides is that the waveguide size establishes lower and upper cut-off frequencies, slicing the spectrum in frequency bands. As an example, the WR-2 standard operates from 325 to 500 GHz, with dimensions 508 μm×254 μm. These dimensions reduce to 254 μm×127 μm for WR-1, operating from 750 to 1100 GHz. These standards restrict the frequency range over which devices operate to the sub-band of the WR standard they have been provided, hindering the existence of systems or devices that can operate over different sub-bands. In addition, to take measures over different WR standards, one must measure in each sub-band with the appropriate pair of microwave extension heads, which makes the measurement considerably more difficult and prevents calibrated measurements across the entire frequency range.

The present invention aims to solve the aforementioned limitations in the existing connection interfaces.

DESCRIPTION OF THE INVENTION

The present invention relates to a new type of interconnection probe for electrical signals that provides an ultra-wide continuous operating frequency range, increasing the maximum frequency beyond the limit of current coaxial connector standards to the Terahertz range and beyond. In addition, this structure is highly versatile and can be used to interface with all current high frequency interconnect standards, either coaxial or any of the rectangular waveguide flange sizes as well as act as a wideband transmitter/receiver antenna for the frequencies within the operating range.

In the present disclosure, the versatility of this new electrical interconnect is demonstrated describing different interconnection scenarios that are enabled by this novel structure, as well as different configurations in which it can be arranged.

A first aspect of the present probe is that comprises a dielectric waveguide structure with a high-pass filter characteristic, enabling the electrical interconnection for signals with frequencies above a low cut-off frequency ($f_{CL}$). The dielectric waveguide has a preferably rectangular section, comprising a first tapered end connectable to an access port of a first electronic device, the access port comprising a first tapered coupler. The dielectric waveguide comprising a second tapered end connectable to an access port of a second electronic device, the access port comprising a second tapered coupler.

For example, the dielectric waveguide structure can be designed to operate over a range starting at a low cut-off frequency ($f_{CL}$) in the microwave range (i.e. between 3 GHz to 30 GHz) or in the millimeter-wave range (i.e. between 30 GHz to 300 GHz), e.g. at an operating frequency of 60 GHz covering a broad frequency range that extends into the Terahertz wave range (i.e. between 300 to 3000 GHz.) and beyond.

A second aspect of the present wideband interconnection probe is that it can further comprise a metal waveguide structure with a low-pass filter characteristic which enables to establish a metallic electrical contact between the access ports of the two electronic devices that allows the interconnection operating frequency range to start at low frequencies (i.e. preferably starting at DC, 0 Hz). This enables the electrical interconnection of signals from 0 Hz up to a high cut-off frequency ($f_{CH}$) in the millimeter-wave range.

For example, the metal waveguide structure can be designed to operate over a range that starts at 0 Hz and extends up into the millimeter-wave range (i.e. between 30 GHz to 300 GHz, e.g. at an operating frequency of 100 GHz). In a preferred embodiment for wideband operation, this metallic waveguide structure operates over a frequency range that starts at low frequency (i.e. starting at DC, from 0 Hz) and extends above the low cut-off frequency of the dielectric waveguide structure ($f_{CH}>f_{CL}$, e.g. above the 60 GHz of previous example).

A third aspect of one example of wideband interconnection probe is that the metal waveguide structure can comprise a at least one tapered coupler structure matching the tapered ends of the dielectric waveguide providing at least one access port in the wideband interconnection probe. At the wider extreme of the tapered coupler, metal contact between the metal waveguide structure and the tapered coupler. This allows to establish the interconnection of low frequency signals through the metal waveguide structure, and the interconnection of the high frequency through the dielectric waveguide.

The dielectric waveguide and metal waveguide structures can be used independently to establish interconnects within their operating frequency ranges. In addition, the present disclosure allows the two structures to be combined to achieve a wideband operation of the interconnect probe operating from DC (0 Hz) to the Terahertz frequency range and above.

BRIEF DESCRIPTION OF THE DRAWINGS

For a better understanding the above explanation and for the sole purpose of providing an example, some non-limiting drawings are included that schematically depict a practical embodiment.

In FIG. 10A to WR-08 at 140 GHz and in FIG. 10B to WR-04 at 220 GHz.

DESCRIPTION OF A PREFERRED EMBODIMENT

Figure 1A:
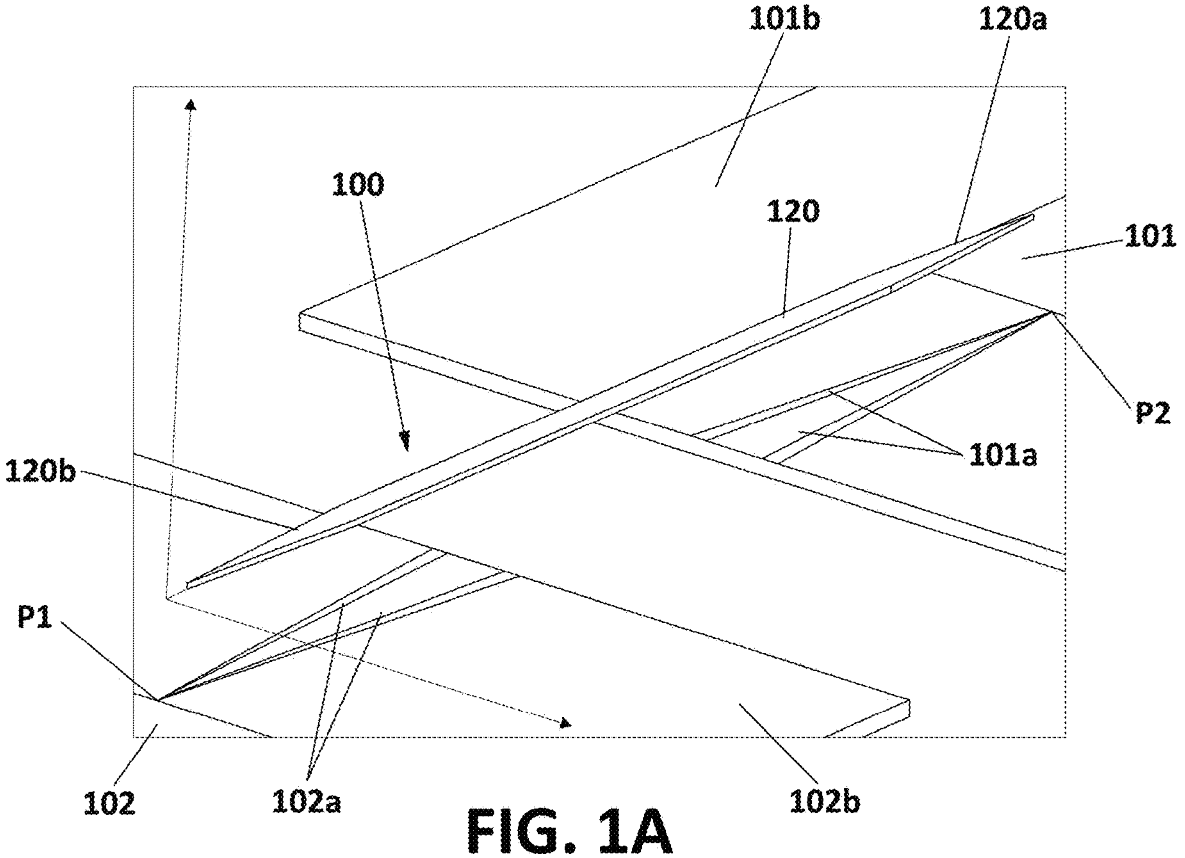
FIGS. 1A and 1B show the interconnection between an example of the proposed ultra-wideband probe structure comprising a dielectric waveguide and two electronic devices each comprising access ports with tapered couplers matching the tapered ends of the dielectric waveguide.

FIG. 1A shows a schematic overview of one example of the proposed ultra-wideband interconnection probe (100) connecting to a first electronic device (101) located on a substrate (101*b*) and to a second electronic device (102) located on a substrate (102*b*).

Figure 1B:
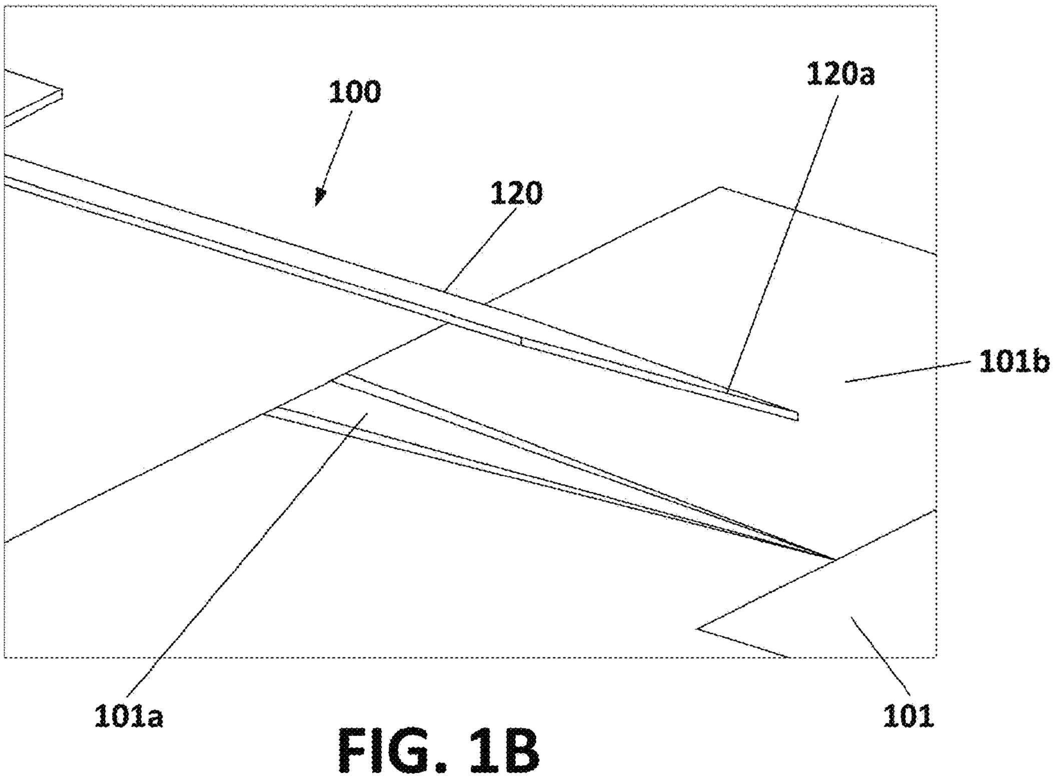

FIG. 1B shows a detailed view of the proposed ultra-wideband interconnection probe (100) that comprises a dielectric waveguide structure (120). The dielectric waveguide structure (120), with a high-pass filter characteristic, establishes the interconnection for the high frequency range signals above the low cut-off frequency ($f_{CL}$). The dielectric waveguide structure (120) comprises a first tapered end (120*a*) connectable to a first access port (P1) of the electronic device (101) via a first tapered coupler (101*a*). The dielectric waveguide structure (120) comprises a second tapered end (120*b*) connectable to a second access port (P2) of the second electronic device (102) via a second tapered coupler (102*a*) of the access port of the second electronic device (102).

In a preferential embodiment of this structure, the central section of the dielectric waveguide structure (120) has a rectangular shape and is terminated at the interconnect interface with a tapered section or tapered end (120*a*) while the access port of the electronic device (101) has a tapered coupler (101*a*) structure matching the first tapered end (120*a*) of the dielectric waveguide structure (120). As shown in FIG. 1B, at the interconnect interface, approaching the dielectric waveguide structure (120) to the tapered coupler (101*a*) on the electronic device substrate (101*b*) of the electronic device (101) allows to establish the interconnection of the ultra-wideband interconnection probe (100) with the electronic device (101) for high frequency through the dielectric waveguide.

Figure 2A:
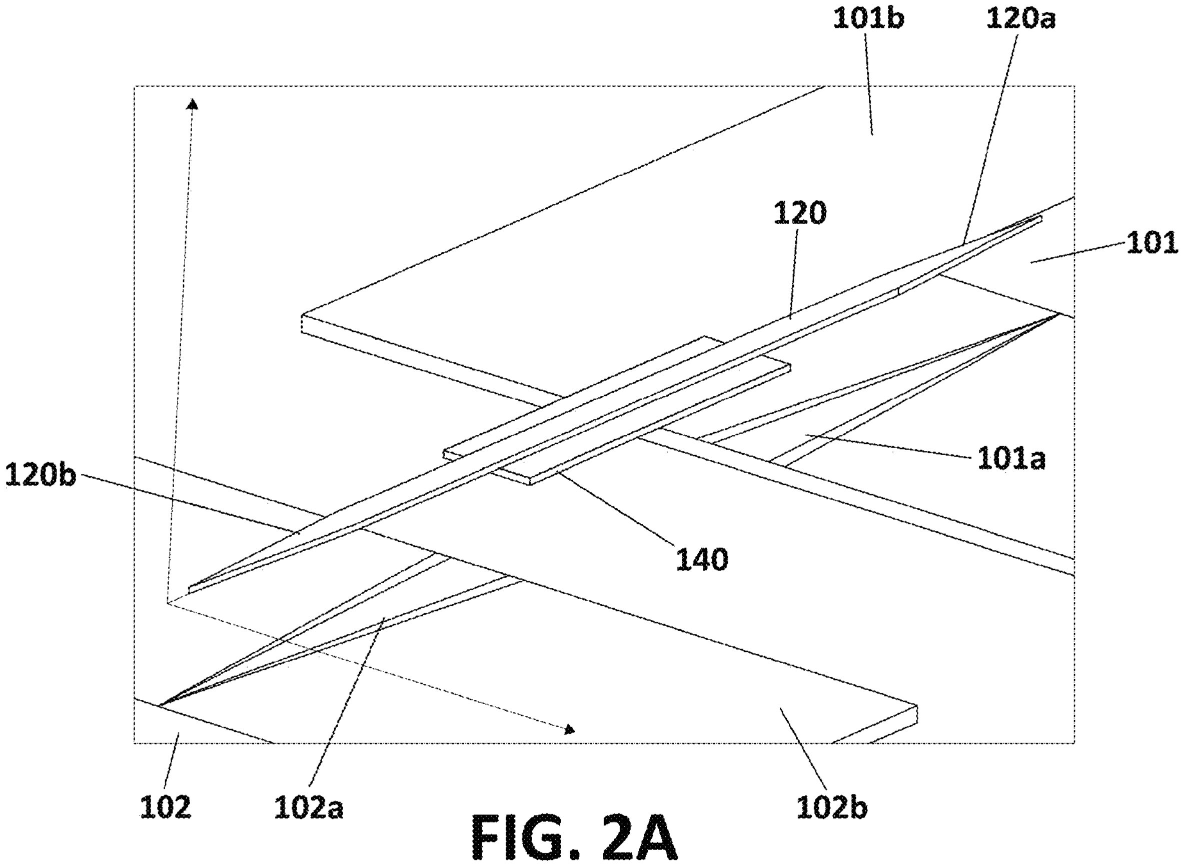
FIGS. 2A and 2B show another example of proposed ultra-wideband interconnect probe according to the present invention enabling the interconnection between two electronic devices, in which a dielectric waveguide is attached to a substrate material.
Figure 2B:
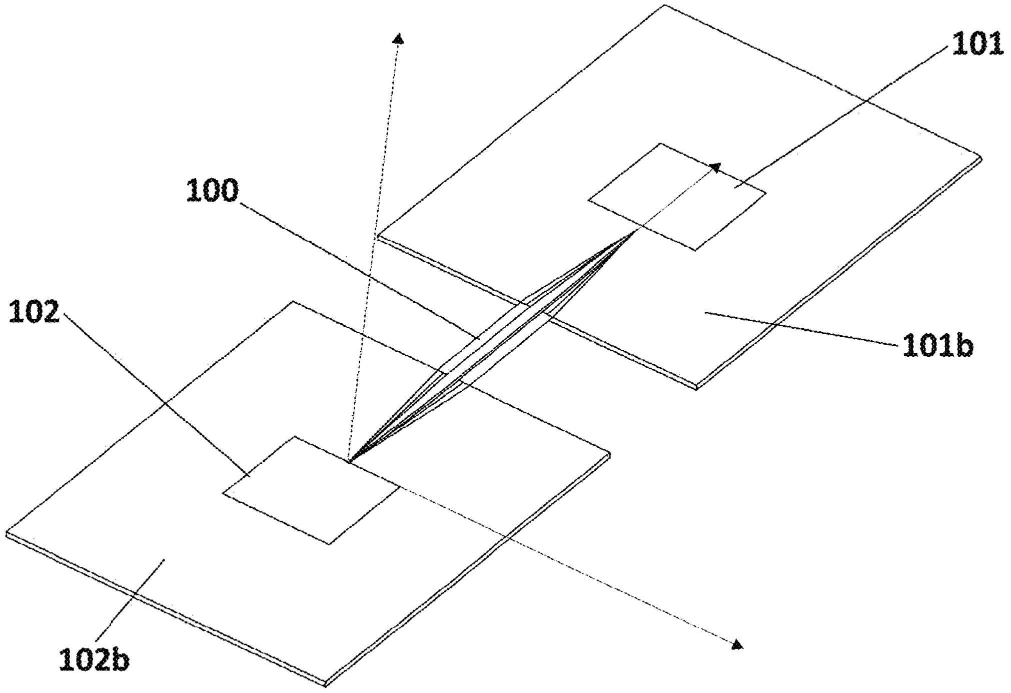

FIGS. 2A and 2B show an interconnect system comprising the proposed probe (100) and wherein the probe (100) connects two electronic devices or circuits (101, 102) providing an ultra-broadband frequency interconnection, and wherein the probe (100) further comprises a substrate (140) connected to the dielectric waveguide structure (120). In such application, the ultra-wideband interconnection probe (100) is used to connect a first electronic device or circuit (101) with a second electronic device or circuit (102). The probe (100) comprising the dielectric waveguide structure (120) establishing a high-pass characteristic interconnect comprising the same shape at both ends, i.e. the first tapered end (120*a*) connectable to the first access port of the electronic device (101) via the first tapered coupler (101*a*) and a second tapered end (120*b*) connectable to the second access port of the electronic device (102) via the second tapered coupler (102*a*) as shown in FIG. 2B. In the present description the tapered ends (120*a*, 120*b*) of the dielectric waveguide structure (120) are symmetric for simplicity, but this does not limit this disclosure to different shapes for the dielectric waveguide structure (120).

As for the connection at high frequencies, this is established by means of the dielectric waveguide structure (120), through near field coupling between the tapered end (120*a*) of the dielectric waveguide structure (120) and the metallic pattern of the tapered couplers (101*a*, 102*a*) of the electronic devices (101, 102). As shown in FIG. 2A, the dielectric waveguide (120) is drawn on top of the continuous substrate (140), representing the dielectric waveguide support substrate followed by the electronic device substrate (101*b*).

Figure 2C:
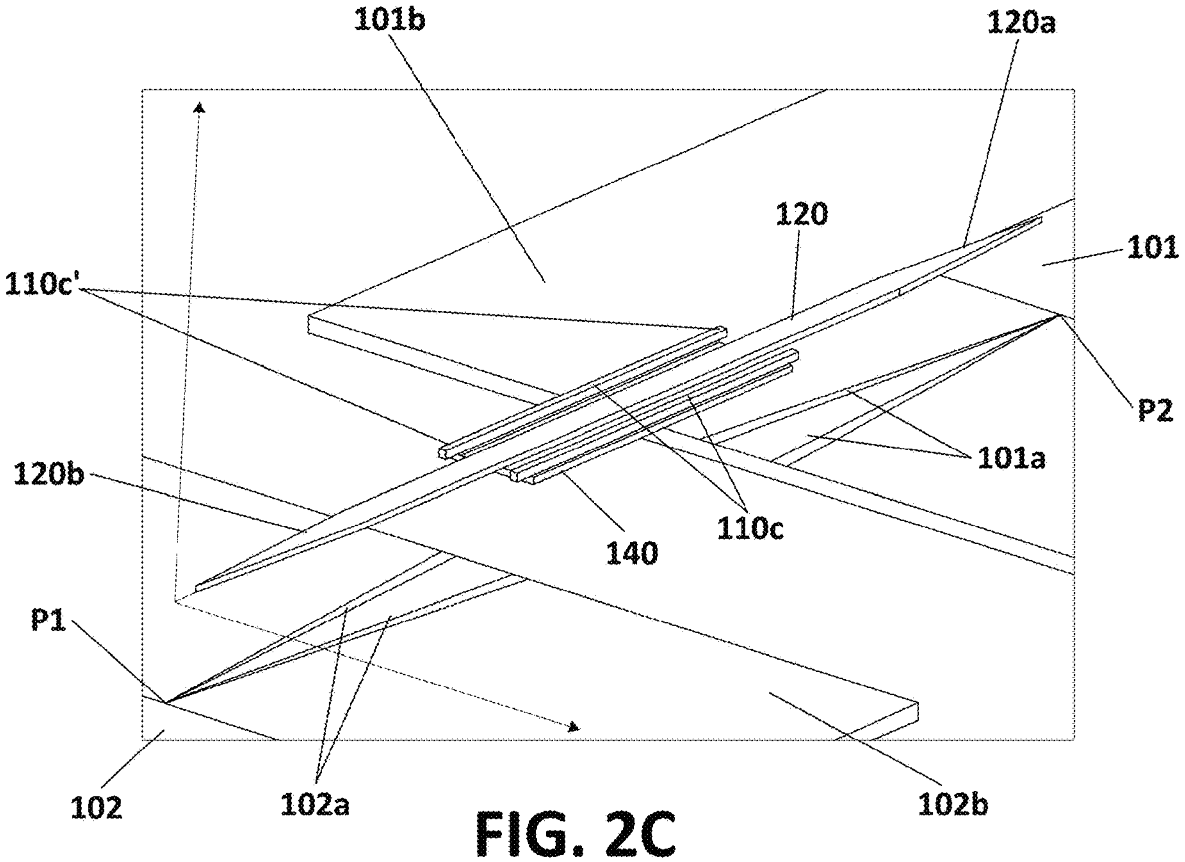
FIG. 2C shows another example of a proposed ultra-wideband probe structure, comprising a dielectric waveguide structure attached to a substrate material on which a metal waveguide structure is defined, having a bifilar line design.

FIG. 2C shows a detailed view of another example of the proposed ultra-wideband interconnection probe (100) wherein the metal waveguide structure (110) defines a bifilar transmission line (110*c*) terminated with probe tips (110*c*') at its extreme to establish metallic contact with the tapered coupler (101*a*) of the access port of the electronic device (101) located on the substrate (101*b*), establishing a low-pass characteristic interconnect for signals with frequencies below the high cut-off frequency ($f_{CH}$). The dielectric waveguide structure (120), with a high-pass filter characteristic, establishes the interconnection for the high frequency range signals above the low cut-off frequency ($f_{CL}$). In other implementations, the bifilar transmission line (110*c*) can be also combined with a TSA (TSA-1*a*).

Since the connection established by the metal waveguide structure (110) is used for low frequencies, the electrical and mechanical requirements of this interconnect are relaxed compared to existing transmission line interconnects through either two (Ground-Signal, GS) or three conductor (Ground-Signal-Ground, GSG) contact probes. The dimension of the contacts can be correspondingly larger (the contact area is 12 μm×12 μm on existing GSG probes in contrast to 500 μm×500 μm in the proposed design). In turn, the larger contact area also allows to increase the electrical bias power supplied to the devices through this hybrid interconnection probe (100). Furthermore, it facilitates the alignment and the survivability of the hybrid interconnection pro be (100) after repeated interconnections or in case of inexpert use.

As for the connection at high frequencies, this is established by means of the dielectric waveguide structure (120), through near field coupling between the tapered end (120*a*) of the dielectric waveguide structure (120) and the tapered coupler (101*a*) of the access port of the electronic device (101) to be connected.

Figure 3A:
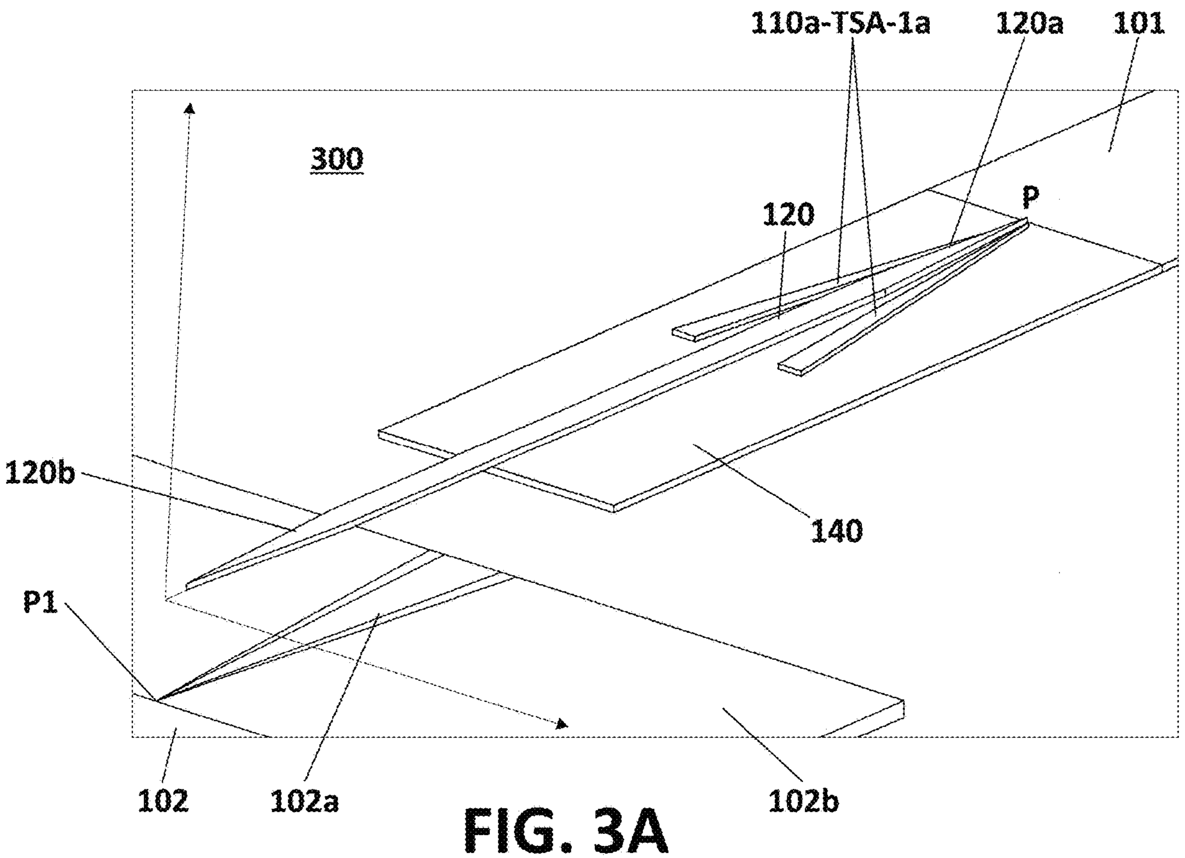
FIG. 3A shows another example of a proposed ultra-wideband probe structure comprising a dielectric waveguide structure attached to a substrate material and includes a metal waveguide pattern defining a tapered coupler along a tapered end of the dielectric waveguide.

FIG. 3A shows another example of a proposed ultra-wideband interconnection probe (300) comprising the dielectric waveguide structure (120) and a substrate (140), the dielectric waveguide structure (120) establishing a high-pass characteristic interconnect which comprises a first tapered end (120*a*) and a second tapered end (120*b*) connectable to an access port via the tapered coupler (102*a*) of the electronic device (102).

The probe (300) comprises a metal waveguide structure defining a metal waveguide pattern (110*a*) with the shape of a tapered coupler, preferably a Tapered Slot Antenna "TSA" (TSA-1*a*) around the first tapered end (120*a*) of the dielectric waveguide structure (120) and which provides a RF access port (P) in the probe (300) which is the point at which electronic signals can be supplied or detected. Furthermore, the second tapered end (120*b*) is connectable to the access port of the electronic device (102) via the tapered coupler (102*a*).

Figure 3B:
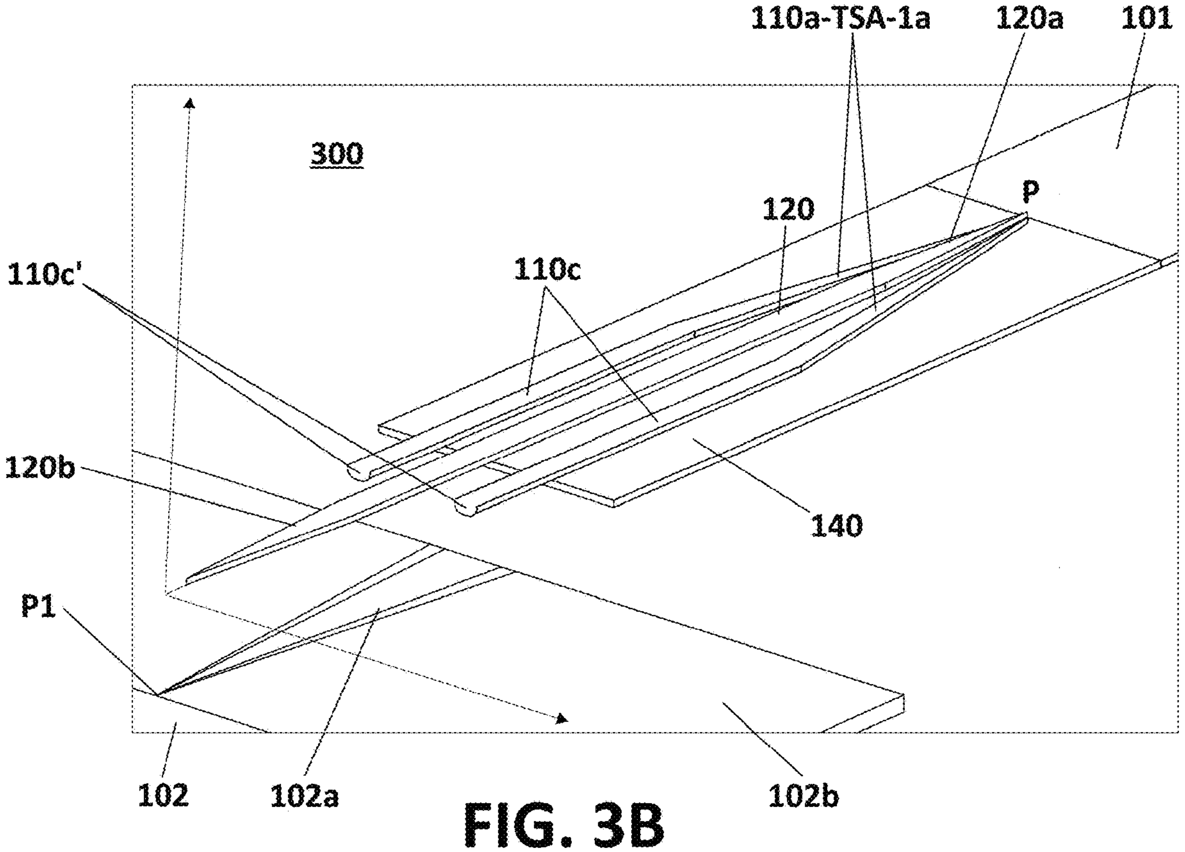
FIG. 3B shows another example of a proposed ultra-wideband probe structure comprising a metal waveguide pattern defining a tapered coupler and a bifilar line terminated with contact tips.

FIG. 3B shows the probe (300) comprising the dielectric waveguide structure (120), the substrate (140), and the metal waveguide structure defining a metal waveguide pattern (110*a*) and a bifilar line with probe tips (1100 which establish a low-pass filter characteristic interconnect, operating over a low frequency range from DC up to a high cut-off frequency $f_{CH}$ in the millimeter wave range.

Figure 4A:
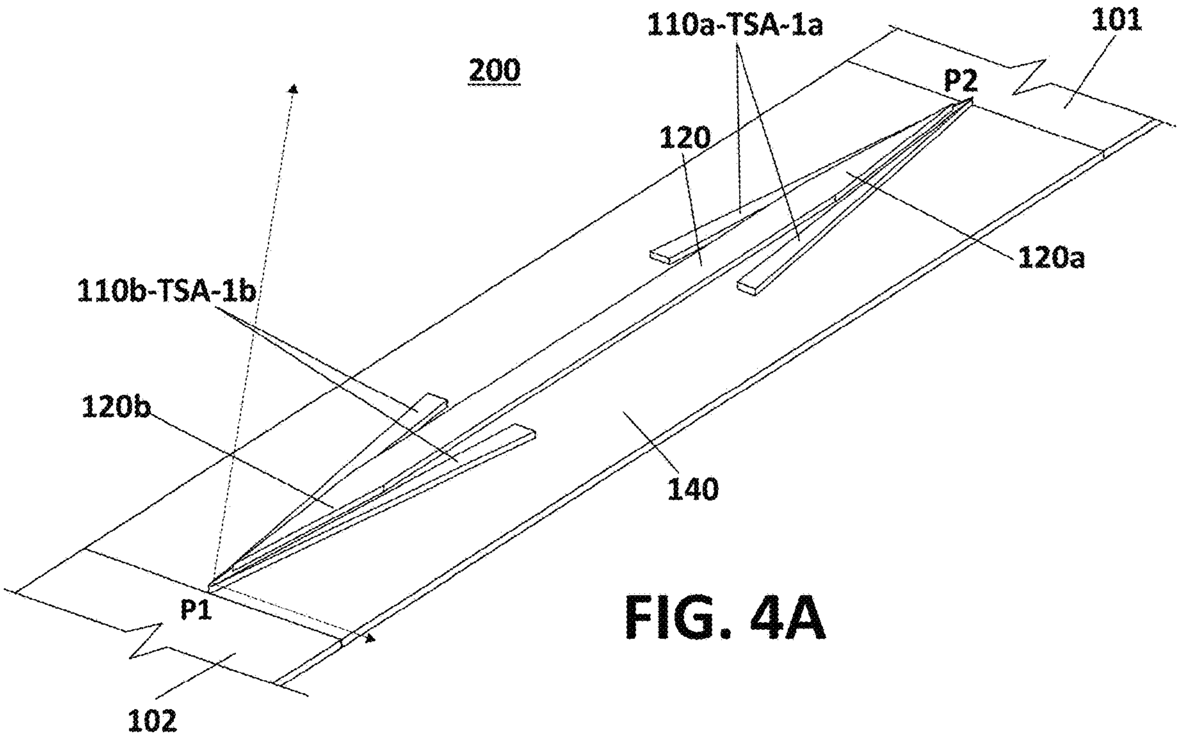
FIGS. 4A and 4B show the relevant electromagnetic elements of another proposed structure when the proposed ultra-wideband interconnect probe comprises a dielectric waveguide structure and metal waveguide patterns defining tapered couplers.
Figure 4B:
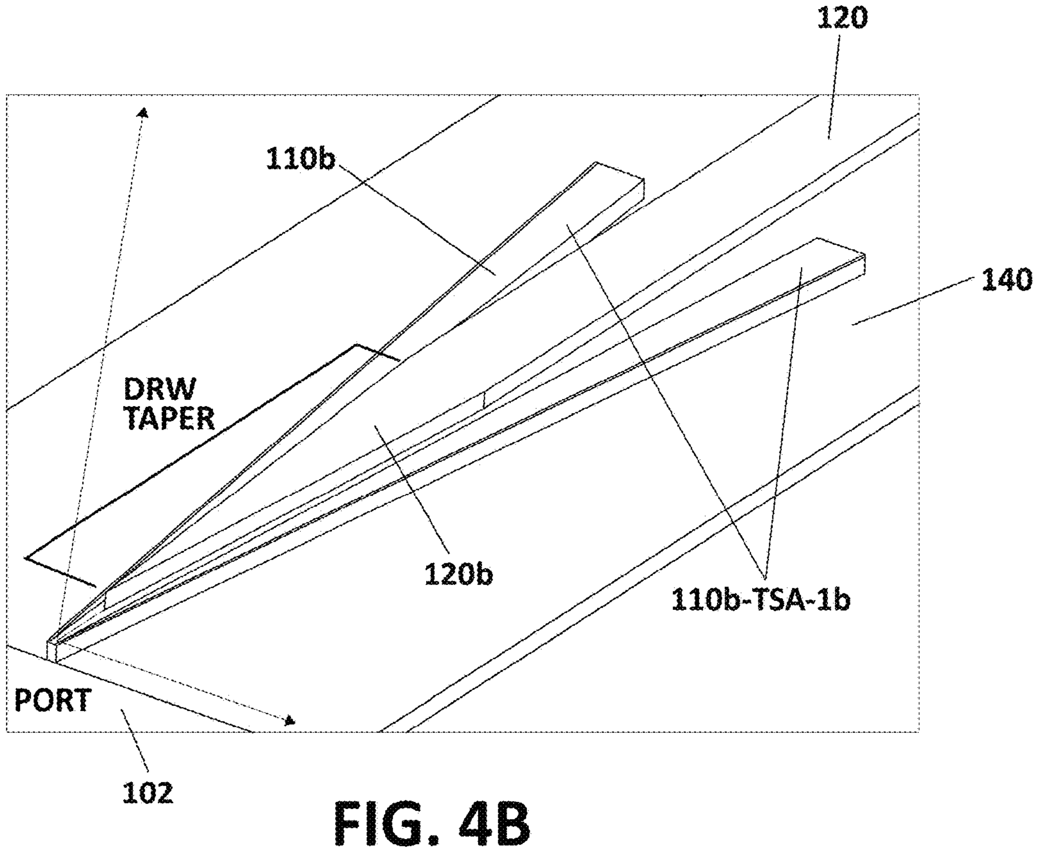

FIGS. 4A and 4B show another ultra-wideband probe (200) according to the present invention that comprises a dielectric waveguide structure (120) establishing a high-pass characteristic interconnect, operating over a high frequency range starting from a low cut-off frequency fa in the microwave range or in the millimeter-wave range. Similarly to the previous probe (100), the dielectric waveguide structure (120) comprises a first tapered end (120*a*) and a second tapered end (120*b*).

Furthermore, the probe (200) comprises a metal waveguide structure (110) establishing a low-pass characteristic interconnect between a first port (P1) and a second port (P2) and which operates over a low frequency range from DC up to a high cut-off frequency ICH in the millimeter wave range.

The metal waveguide structure (110) of the probe (200) comprises a first metal waveguide pattern (110*a*) defining a first tapered coupler connectable to the first device (101), preferably a Tapered Slot Antenna "TSA" (TSA-1*a*) around the first tapered end (120*a*) of the dielectric waveguide structure (120) and a second metal waveguide pattern (110*b*) defining a second tapered coupler connectable to the second device (102), preferably a Tapered Slot Antenna "TSA" (TSA-1*b*) around the second tapered end (120*b*) and a substrate (140).

Figure 4C:
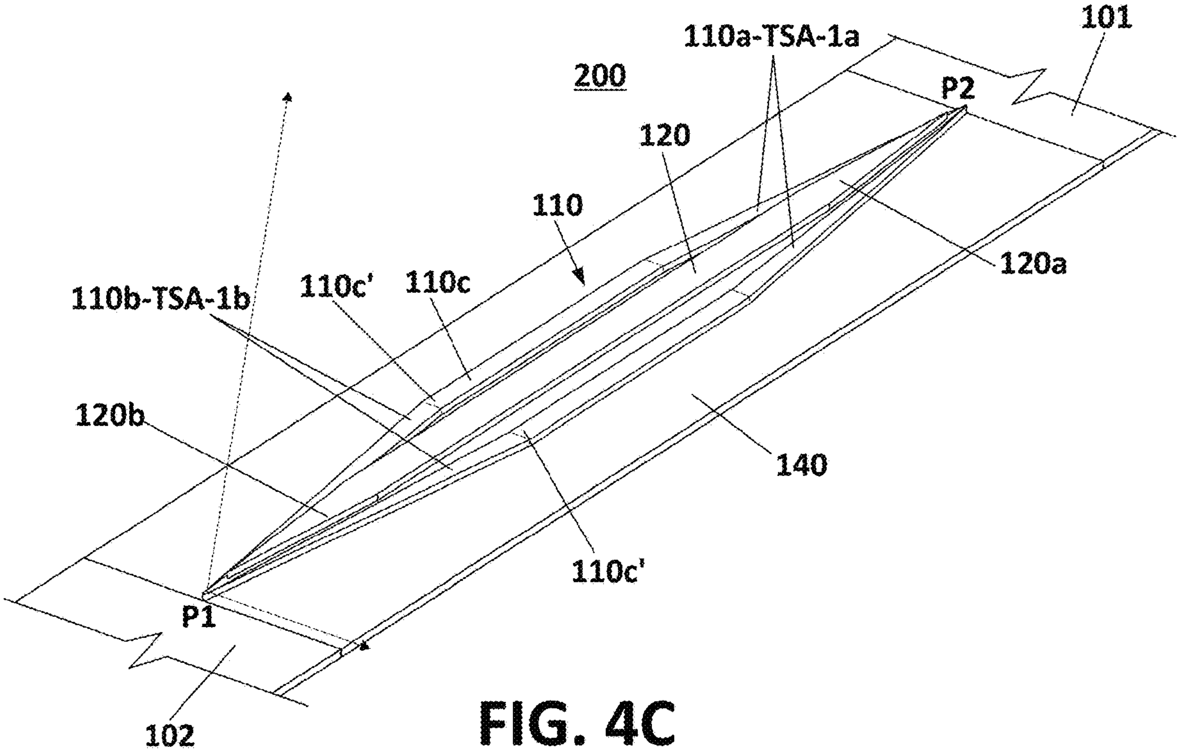
FIGS. 4C and 4D show the relevant electromagnetic elements of another proposed structure when the proposed ultra-wideband interconnect probe comprises metal waveguide patterns defining tapered couplers and a bifilar line.
Figure 4D:
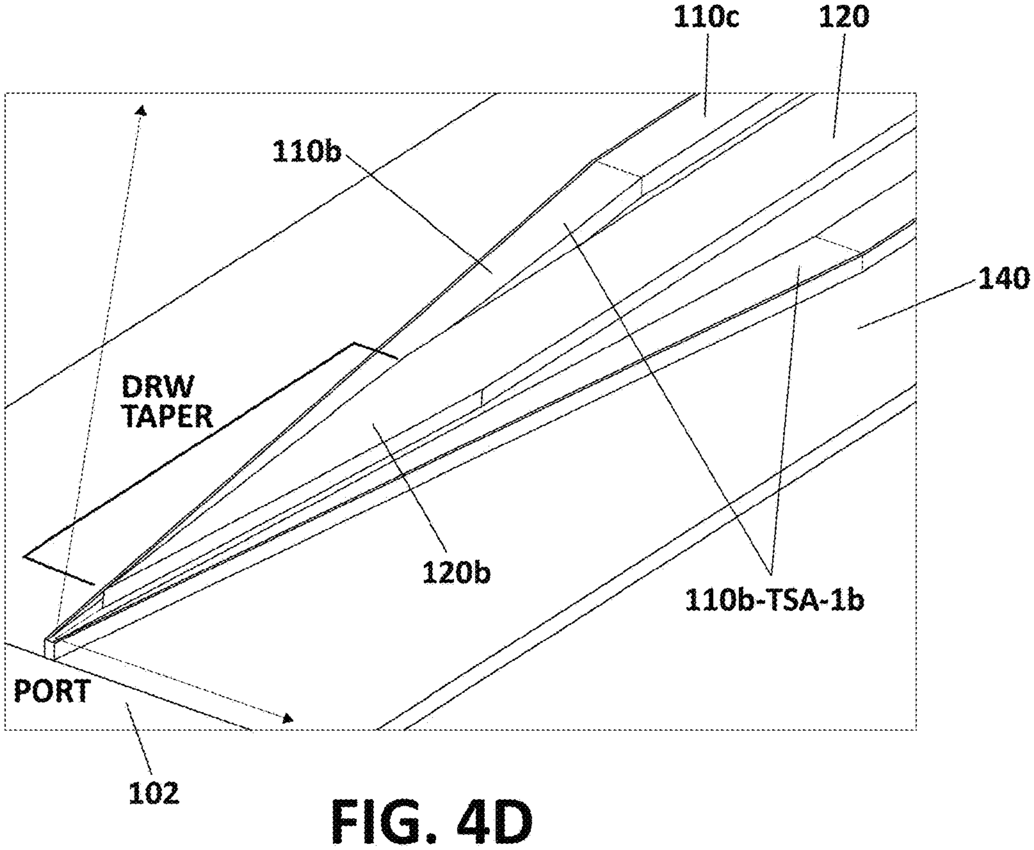

FIGS. 4C and 4D represents another implementation of the hybrid interconnection probe (200). FIGS. 4C and 4D show the metal waveguide structure (110) which comprises first and second metal waveguide patterns (110*a*, 110*b*), each defining tapered couplers, preferably Tapered Slot Antennas "TSA", (TSA-1$a$) and (TSA-1$b$) on both sides of the central dielectric waveguide structure (120) tapered end sections (120$a$, 120$b$). The metal waveguide structure (110) further comprises the bifilar transmission line (110$c$) having probe tips (110$c$") that establishes a low-pass characteristic interconnect, operating over a low frequency range from DC up to a high cut-off frequency $f_{CH}$ in the millimeter wave range. The hybrid interconnection probe (200) also comprises a substrate (140) connected to the metal waveguide structure (110) and to the dielectric waveguide structure (120). The preferred mode of excitation of this transmission line is such that a single mode propagates throughout the hybrid interconnection probe (200). FIG. 4C details the launcher section of the hybrid interconnection probe (200), which enables the single mode excitation to be attained.

On the extremes of the ultra-wideband interconnection probe (200), signal access ports are provided, where ports (P1) and (P2) are the points at which electronic signals can be supplied or detected. In order to demonstrate the broadband characteristic of the interconnection ultra-wideband interconnection probe (200), port (P1) is used to inject a signal (transmitter port) and port (P2) to observe the signal (receiver port) interconnected by means of the proposed ultra-wideband interconnection probe (200) which behaves as a transmission line for a wide range of frequencies.

In one example, the permittivity of the dielectric waveguide elements that are stacked can be the same, processed in the same material. This is not a restriction of the present disclosure, in which the dielectric materials of each layer can be different. In FIGS. 4, the substrate (140) on which the first and second metal waveguide patterns (110$a$, 110$b$) are located may or may not be the same as that for the dielectric waveguide structure (120), although the structure transmits with lower insertion loss and even higher frequencies when the permittivity of the substrate is less than or equal to that of the dielectric waveguide structure (120).

Figure 5:
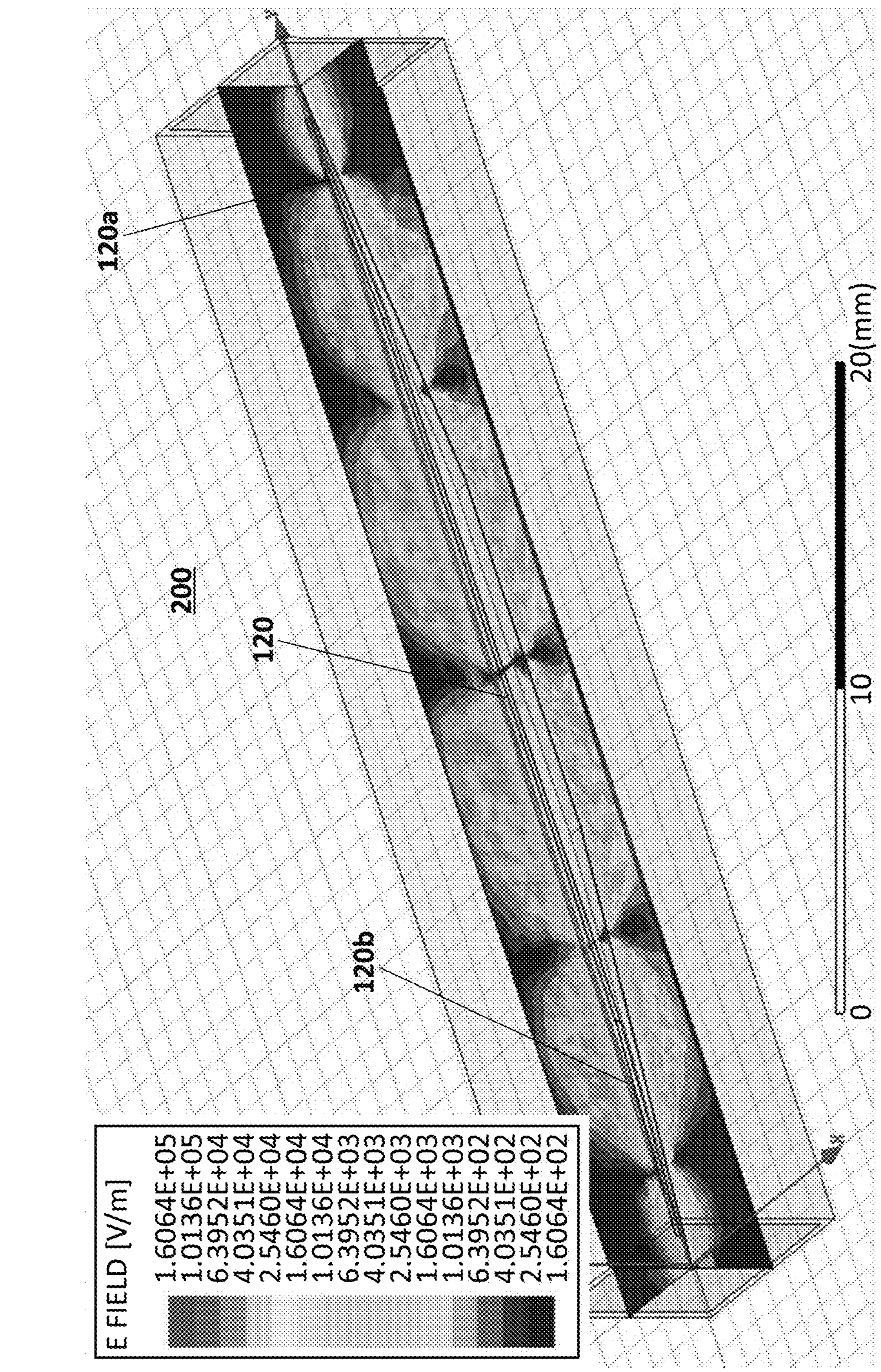
FIG. 5 shows a distribution of a simulated electric field amplitude at 10 GHz of the proposed structure shown in FIGS. 4C and 4D.
Figure 6:
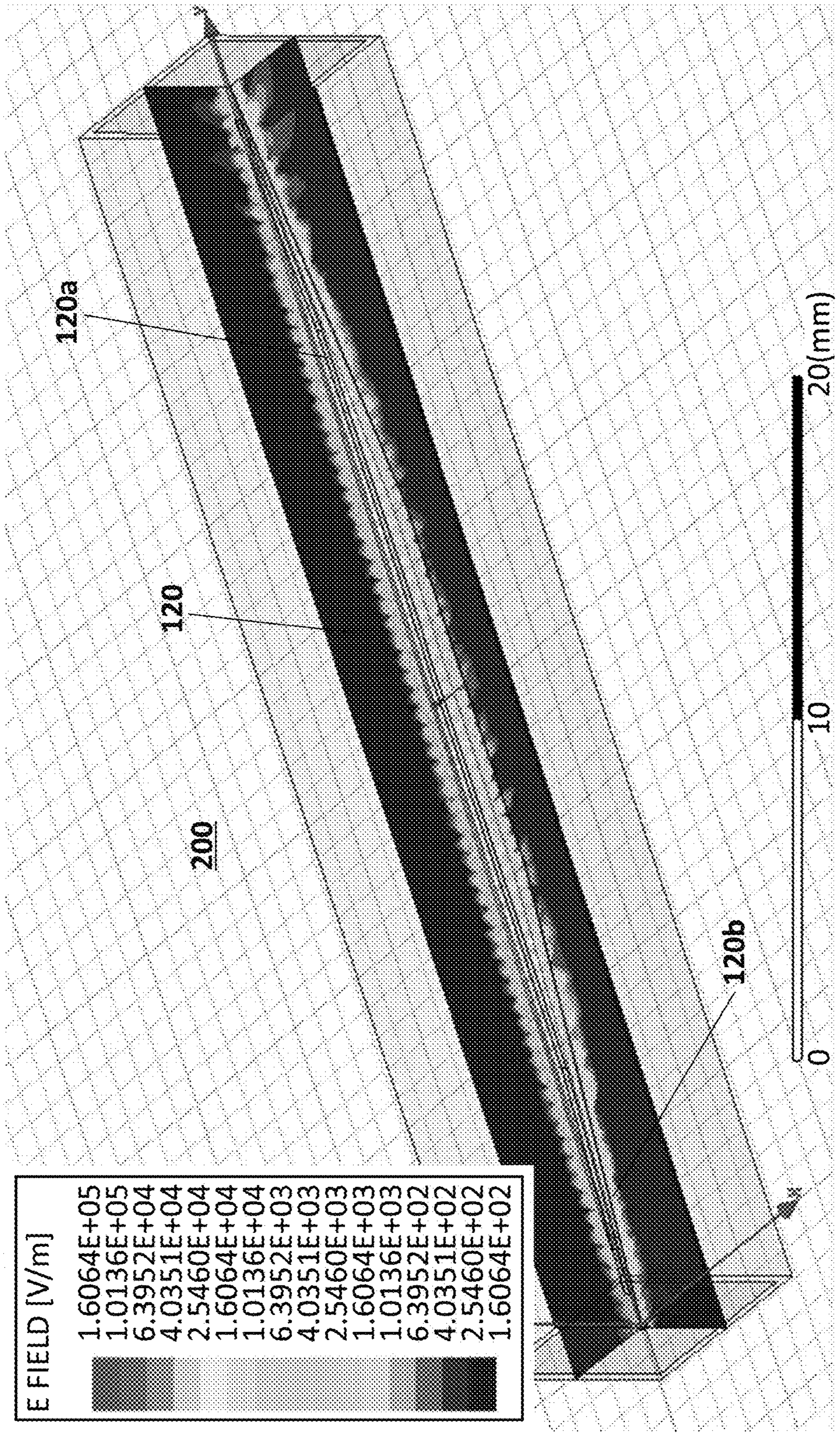
FIG. 6 shows a distribution of a simulated electric field amplitude at 100 GHz of the proposed structure shown in FIGS. 4C and 4D.

In the ultra-wideband interconnection probe (200) of FIG. 4C, the combination of the bifilar transmission line (110$c$) and the dielectric waveguide structure (120) allows to extend the low frequency range due to the bifilar transmission line (110$c$). The dielectric waveguide structure (120) ability to guide signals at the low frequency range can be poor, so the behavior of the proposed ultra-wideband interconnection probe (200) at low frequencies is dominated by the bifilar transmission line (110$c$). The behavior of this structure at low frequency, at an operating frequency of 10 GHz, presents the distribution of the electric field amplitude shown in FIG. 5 for the proposed structure shown in FIGS. 4C and 4D. The TSA antennas (TSA-1$a$, TSA-1$b$) adapt the characteristic impedance of the central bifilar transmission line (110$c$) to the characteristic impedances of both ends, ports (P1) and (P2) to maximize the transmission between them. As the signal frequency increases into the transition frequency range, the signal couples through nearfield from the TSA antennas (TSA-1$a$, TSA-1$b$) into the dielectric waveguide structure (120). FIG. 6 shows this situation, representing the electric field amplitude distribution at 100 GHz, when the signal travels through the dielectric waveguide structure for the proposed structure shown in FIGS. 4C and 4D.

In one implementation, the proposed ultra-wideband interconnection probe (200) comprising the first and second metal waveguide patterns (110$a$, 110$b$) and the tapered ends (120$a$, 120$b$) of the dielectric waveguide structure (120) can perform as antennas. This allows defining the phase center of the radiated electromagnetic wave at each frequency to optimize the coupling between both structures, the metal waveguide structure defining TSA antennas (TSA-1$a$) and (TSA-1$b$) and the respective dielectric waveguide tapered ends (120$a$) and (120$b$). For ultra-broadband operation, the phase center of the electromagnetic wave on both structures must be overlapped at every frequency within the operating range. This can be achieved by using the same type of taper profile for both structures, the first and second metal waveguide patterns (110$a$, 110$b$) and the dielectric waveguide structure (120). A linear profile for both structures i.e. the first and second metal waveguide patterns (110$a$, 110$b$) and respective dielectric waveguide tapered ends (120$a$, 120$b$) has been used. This is the preferred implementation, with the same aperture angle in terms of simplicity and coupling. The present disclosure does not however limit to this profile, and other configurations can be considered, including the case where different ports can have different tapering profiles.

In another implementation, the proposed ultra-wideband interconnection probes (100, 200) comprising the first and second metal waveguide patterns (110$a$, 110$b$) and the tapered ends (120$a$, 120$b$) of the dielectric waveguide structure (120) can perform as a near field coupler.

Figure 7:
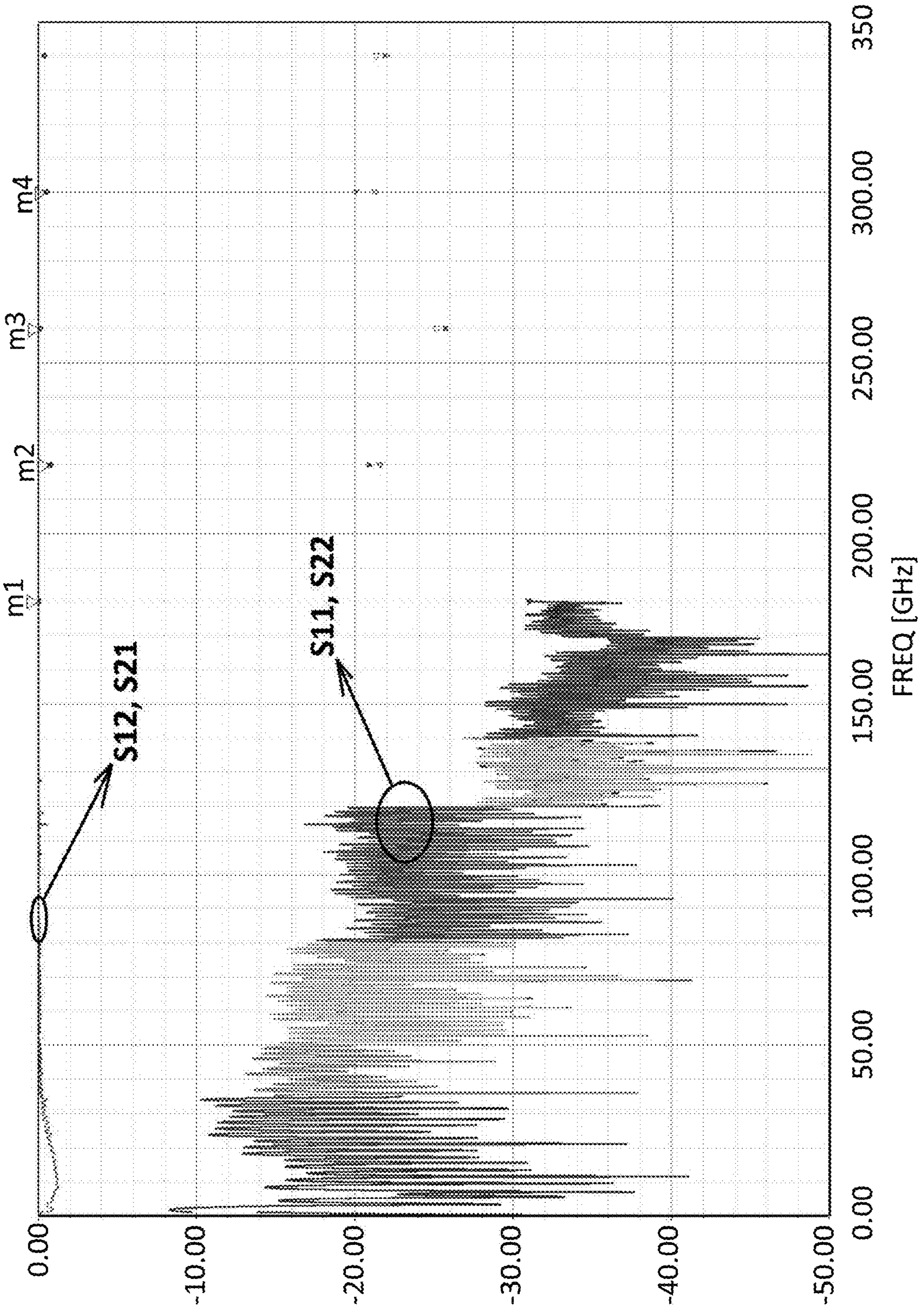
FIG. 7 shows a simulation of the S-parameters of the proposed structure between access ports P1 and P2 shown in FIGS. 4C and 4D.

Given the broad bandwidth, the ultra-wideband interconnection probes (100, 200) are electrically large at high frequencies, which allows higher order modes to propagate through the structure. By the arrangement overlapping the phase centers of the electromagnetic waves at all frequencies, an additional advantage of suppressing, or at least mitigating the excitation of higher order modes is achieved. When multimode propagation happens, signal drops appear in the transmission due to destructive interference among the modes that propagate at different speeds introducing dispersion. FIG. 7 shows the simulated S parameters of the probe (200) shown in FIGS. 4C and 4D, in which S12 and S21 describe the transmission between ports (P1) and (P2). As shown, these parameters are close to 0 dB without drops, which indicates a lossless (or almost lossless) transmission in a single fundamental mode. Hence, with the proposed ultra-wideband interconnection probe (200), it is possible to mitigate said superior modes since a null-free S-parameter representation can be appreciated (i.e. parameter amplitude S12 and S12 close to 0 dB, FIG. 7). The amplitude of S11 and S22 in dB is desired to be as low as possible.

Figure 8:
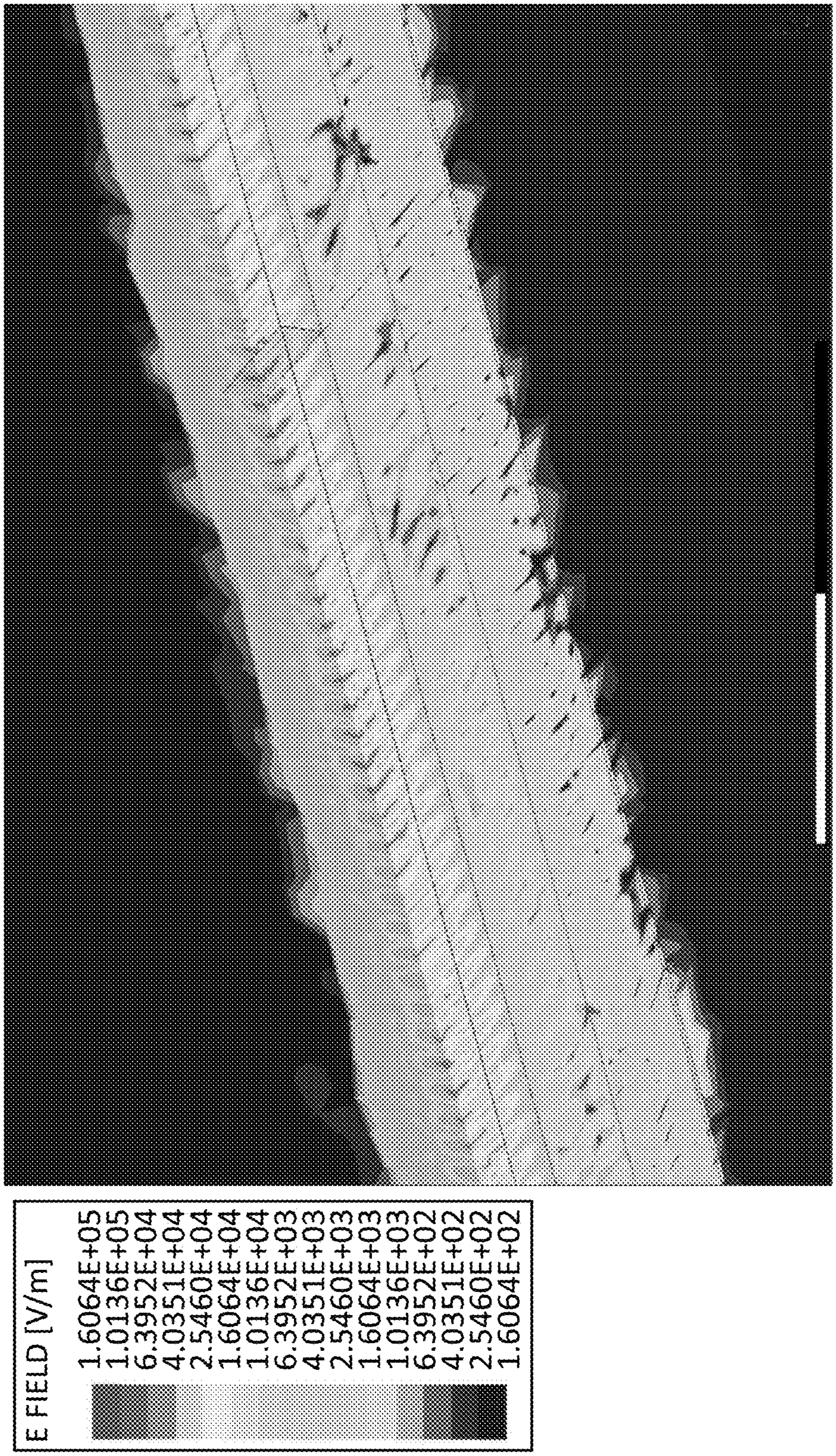
FIG. 8 shows a distribution of a simulated electric field amplitude at 340 GHz (Terahertz range) in the proposed structure shown in FIGS. 4C and 4D.

The results shown in FIG. 7 for the ultra-wideband interconnection probe (200) were simulated with a narrow frequency step to rule out narrowband transmission nulls from 10 MHz to 180 GHz. Due to the associated computational cost, discrete frequency points are shown above 180 GHz (at 220 GHz marker m2—, 260 GHz-marker m3—, 300 GHz-marker m4— and 340 GHz-dot—) to demonstrate the broadband operating frequency range of the structure. Clearly, at 340 GHz, there is still a predominance of the fundamental mode as FIG. 8 represents showing the distribution of simulated electric field amplitude at 340 GHz (Terahertz range) (logarithmic amplitude scale) for the proposed structure shown in FIGS. 4C and 4D. In particular, FIG. 8 shows a detail in the central section of the ultra-wideband interconnection probe (200). It can be seen how most of the power travels in a single fundamental way inside the dielectric waveguide structure (120). With this, it can be demonstrated that the highest cut-off frequency of the structure has not been reached in simulation and extends into the Terahertz range.

In FIG. 7, the frequency range from 5 GHz to 20 GHz is highlighted, which in this example is the transition frequency band, where the ultra-wideband interconnection probe (200) presents insertion losses between 1 dB and 1.5 dB and an appreciable ripple due to the overlap of the ultra-wideband interconnection probe (200), operating as a bifilar transmission line (110*c*) and dielectric waveguide structure (120).

Figure 9A:
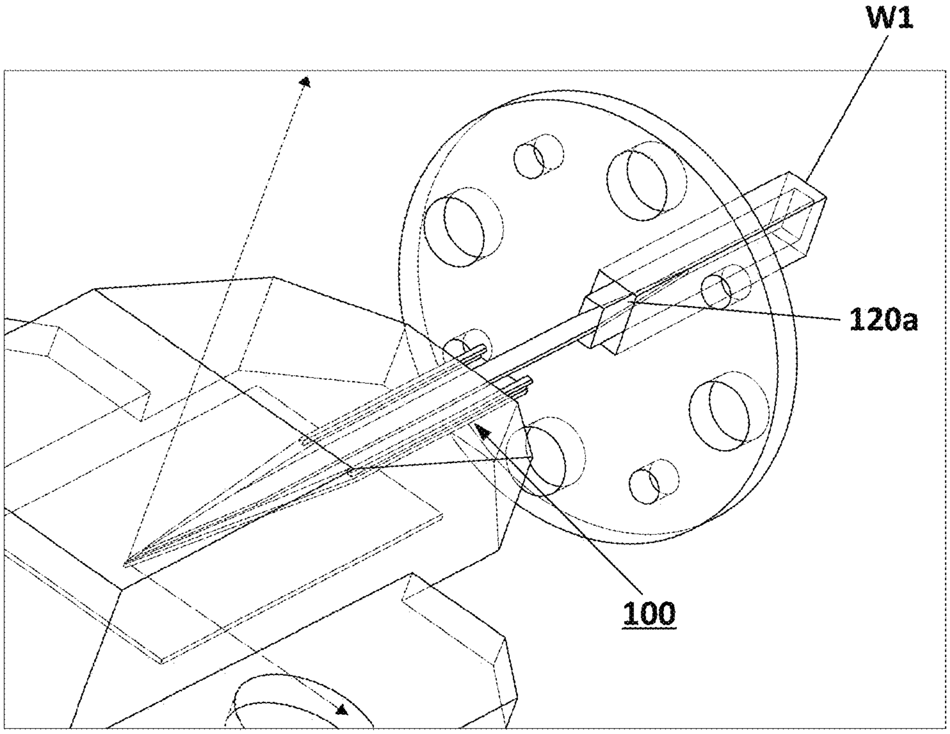
FIGS. 9A and 9B show the proposed structure in FIG. 3B connecting to different rectangular metal waveguide standards.
Figure 9B:
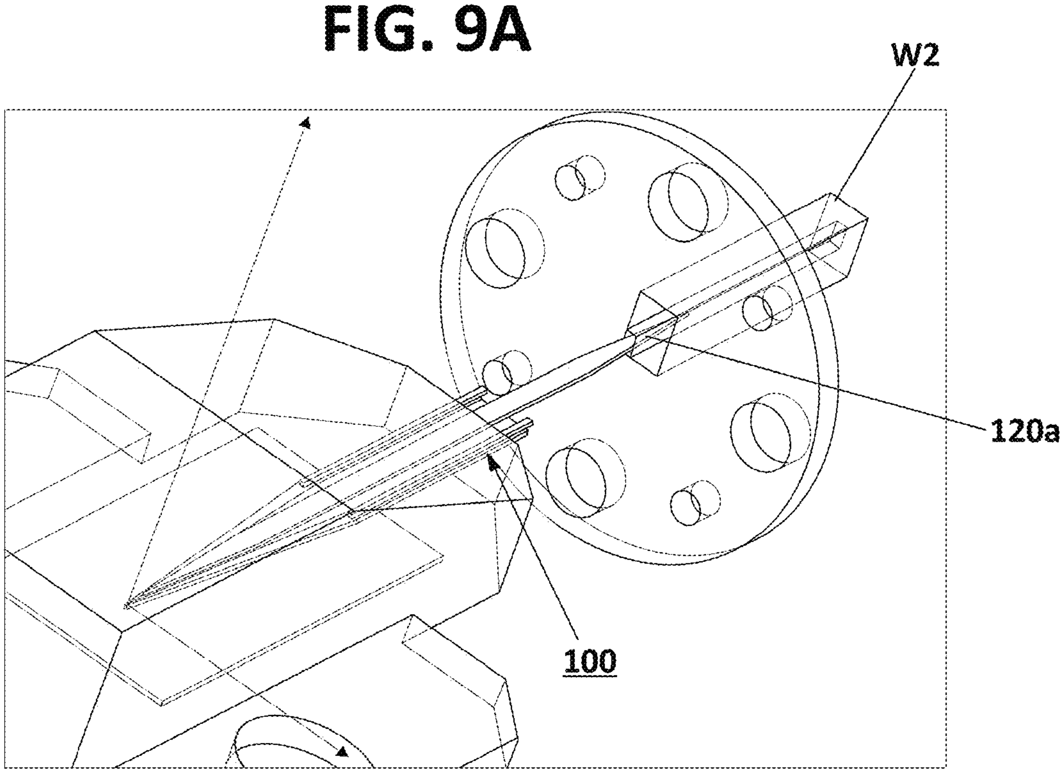
Figure 10A:
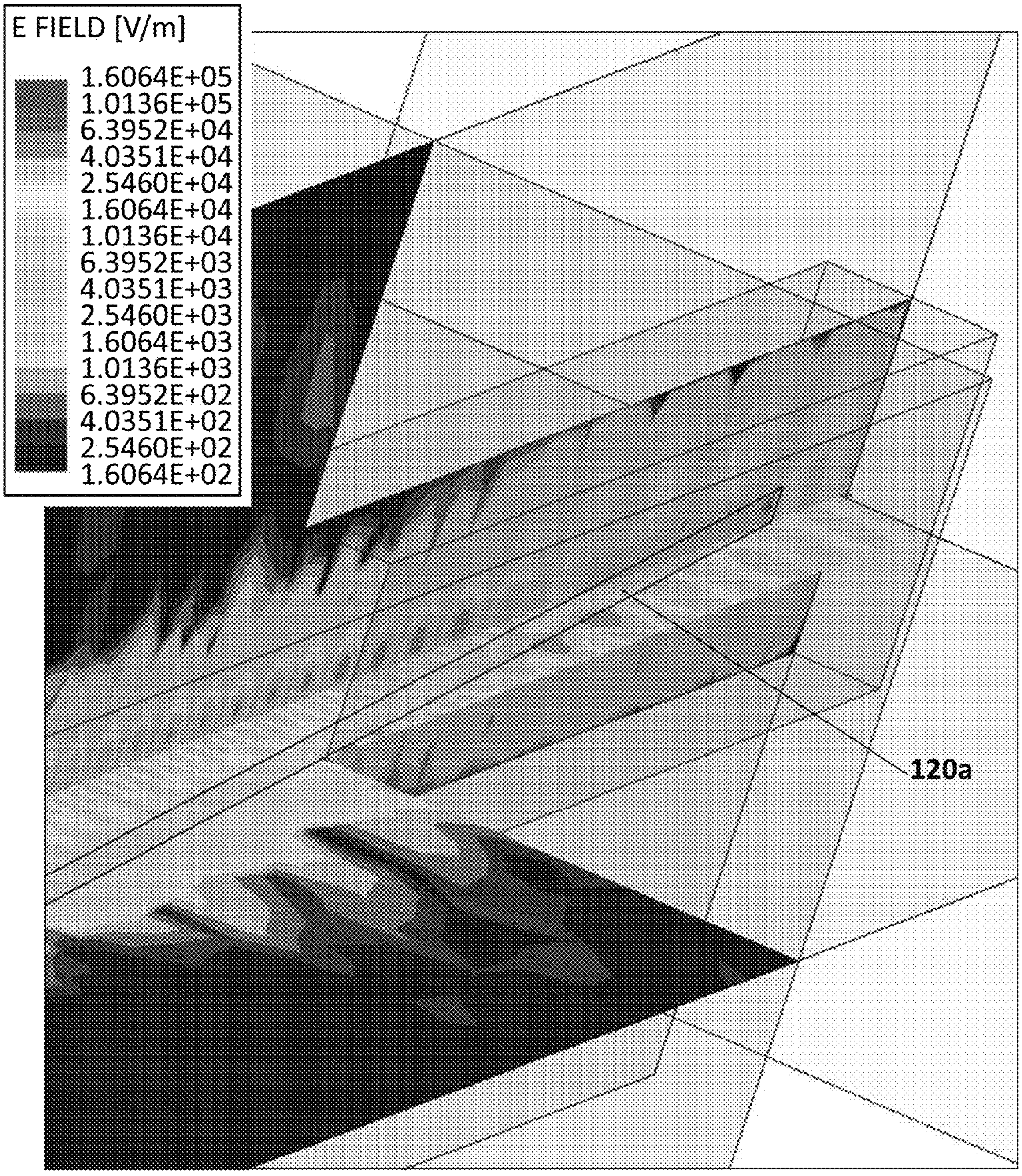
FIGS. 10A and 10B show a simulated electric field amplitude distribution of the proposed structure shown in FIG. 2C coupling to different rectangular metal waveguide standards.
Figure 10B:
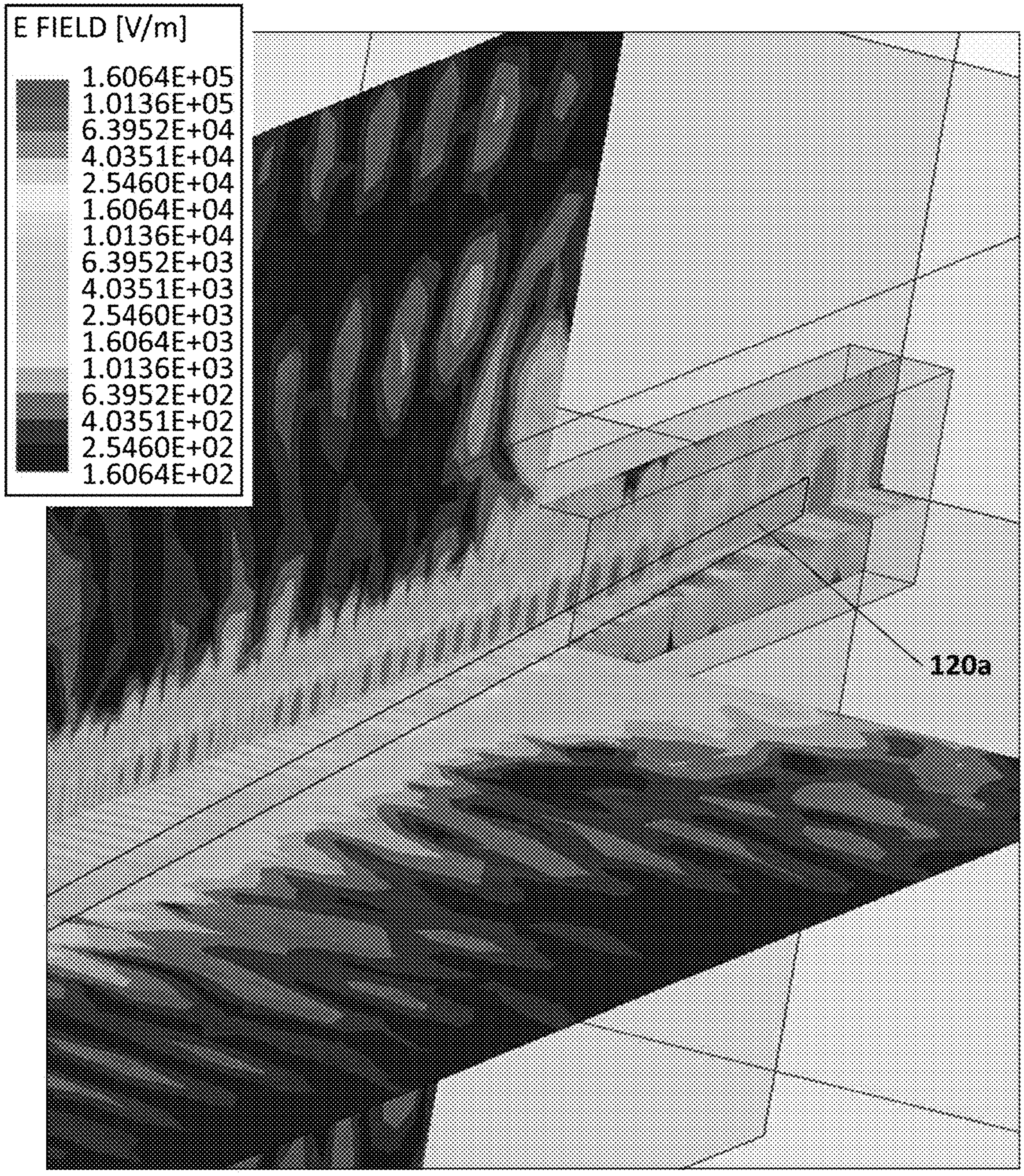
Figure 12A:
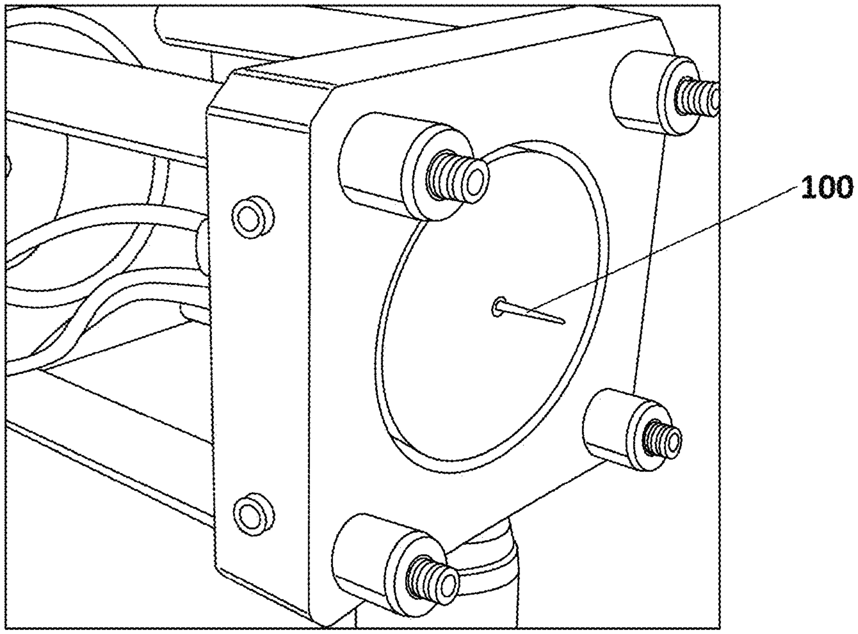
FIG. 12A, shows the propose structure in FIG. 3A or 3B working as an antenna
Figure 12B:
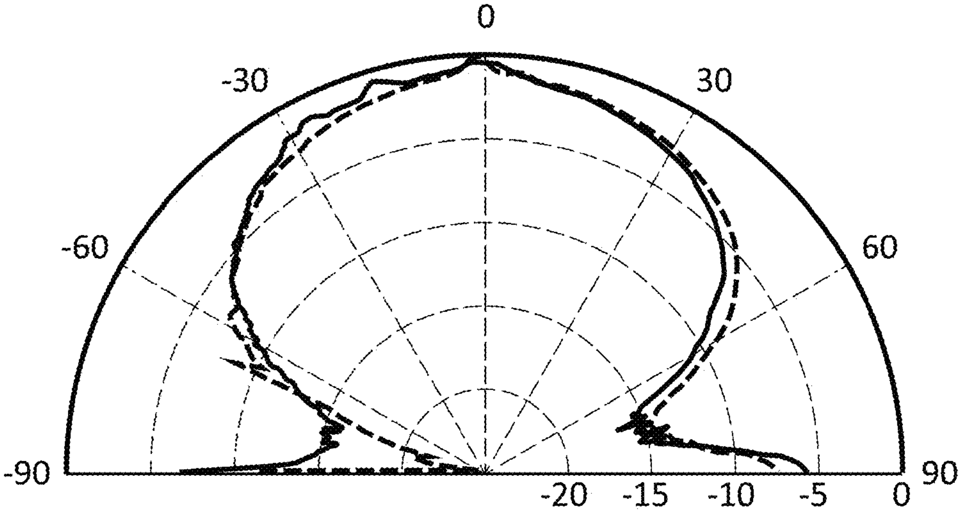
FIG. 12B shows the radiation pattern of the proposed structure in FIG. 3A or 3B working as an antenna.

Another advantage of the disclosed interconnect probes, which results from the extremely wide continuous operating frequency range of the proposed ultra-wideband interconnection probes relates to the capability to establish an interconnection with multiple rectangular and circular waveguide connectors, including IEEE Standards for Rectangular Waveguides. FIGS. 9A and 9B show how the proposed interconnect ultra-wideband interconnection probe (100) shown in FIG. 3B can be used to interface with two different rectangular waveguide standard flange sizes, adapting the depth of penetration of the dielectric waveguide structure into the rectangular waveguide depending on the flange size without requiring any modification of the proposed interconnect ultra-wideband interconnection probe (100) and without causing any additional losses. The tapered end (120*a*) of the waveguide the launches the fundamental mode in the connector into the rectangular waveguide. Therefore, with the proposed ultra-wideband interconnection probe (100), the end (120*a*, 120*b*) of the dielectric waveguide structure (120) can be mechanically inserted into the opening of the rectangular waveguide (W1, W2) to couple the propagating field. In this scenario, the operating frequency band can be determined by the rectangular waveguide standard and not by the ultra-wideband interconnection probe (100). This interconnect would be possible with the different arrangements of the proposed structure (100). FIGS. 12A and 12B show the distribution of the simulated electric field amplitude for the same structure coupled to a WR-8 guide at 140 GHz (W1 in FIG. 9A) and a WR-4 guide at 220 GHz (W2 in FIG. 9B).

Figure 11:
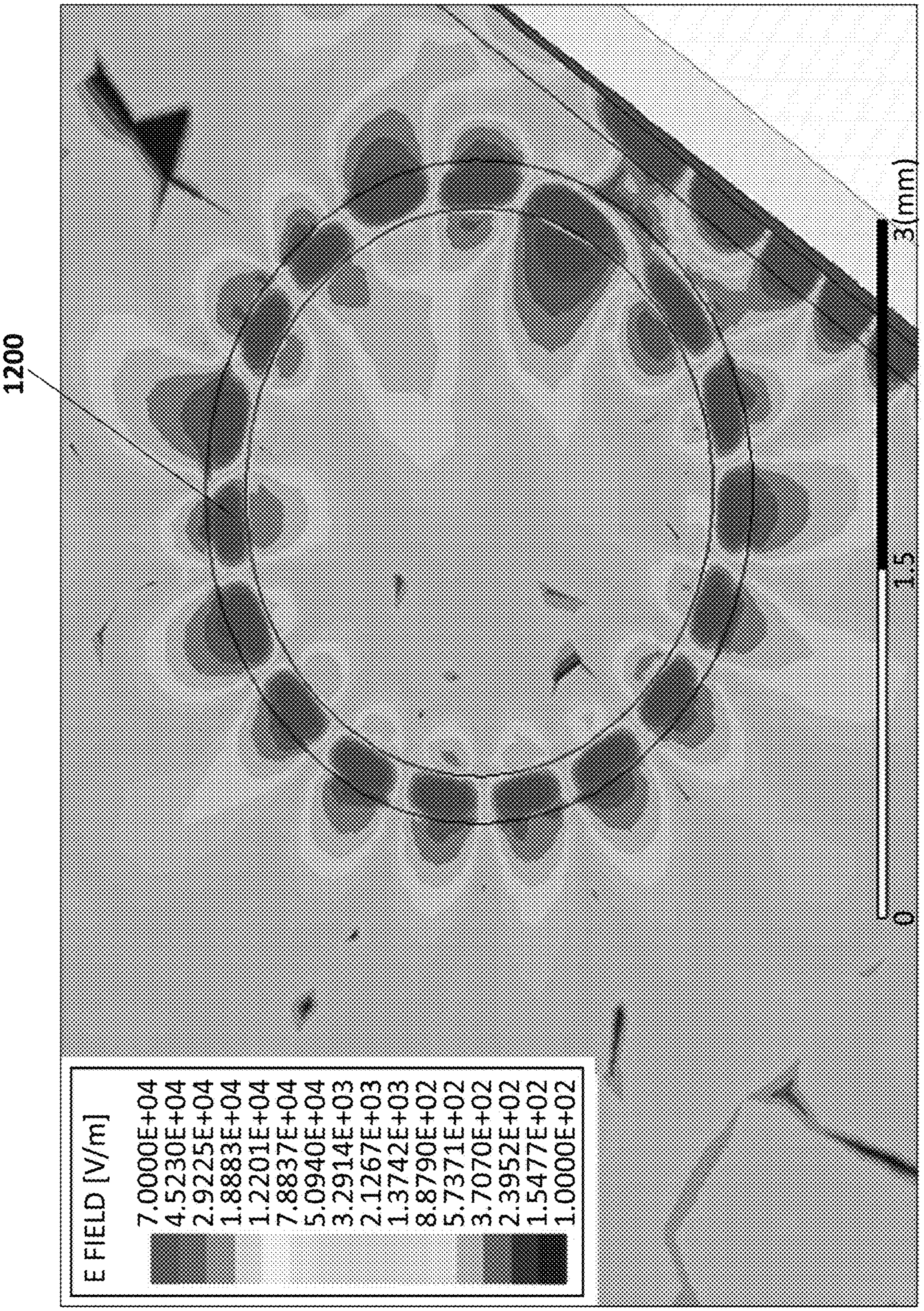
FIG. 11 shows a 200 GHz simulated electric field amplitude distribution of the structure shown in FIG. 3A or 3B coupling to another dielectric structure.

Another advantage relates to the capability of the proposed ultra-wideband interconnection probe (100) to couple the signals to other dielectric structures. Since unlike coaxial cables and rectangular waveguides, the electromagnetic field propagating through the proposed ultra-wideband interconnection probe (100) is not confined within it, the dielectric waveguide structure (120) can be used for near field coupling to other dielectric structures. As an example, FIG. 11 shows a 200 GHz simulated electric field amplitude distribution of the end of the dielectric waveguide structure (120) shown in FIG. 3A or 3B coupling an electromagnetic signal to a toroidal dielectric resonator (1200), generating a whispering gallery mode (WGM) within the structure.

Another advantage relates to the ability of the proposed ultra-wideband interconnection probes (100, 200) to radiate the electromagnetic wave propagating through the ultra-wideband interconnection probes into the air, as a free space antenna. FIG. 12A shows the propose structure in FIG. 3A or 3B working as an antenna used as a prototype of dielectric waveguide antenna optimized at 150 GHz both in transmission and reception scenarios. FIG. 12B shows the radiation pattern of the proposed structure in FIG. 3A or 3B working as an antenna shown at 150 GHz. The signal is radiated in a single main lobe, so it can be integrated into radio frequency optical systems with spatial directivity of the beam.

When the ultra-wideband interconnection probes (100, 200) are considered as an antenna, it immediately allows to develop transmitter and receiver devices, adding to the antenna a transmitter (for example, a photomixer) or a receiver (for example, a Schottky diode) devices at the TSA antenna of the first metal waveguide pattern (110*a*) of the ultra-wideband interconnection probes (100, 200). In the simulation, it is assumed a point source at access ports (P1) for the transmitter and (P2) for the receiver (FIGS. 4A, 4B). In a possible embodiment, the transmitter side (FIG. 13) places a photodiode (P3) at the apex of the TSA antenna of the first metal waveguide pattern (110*a*).

Figure 13:
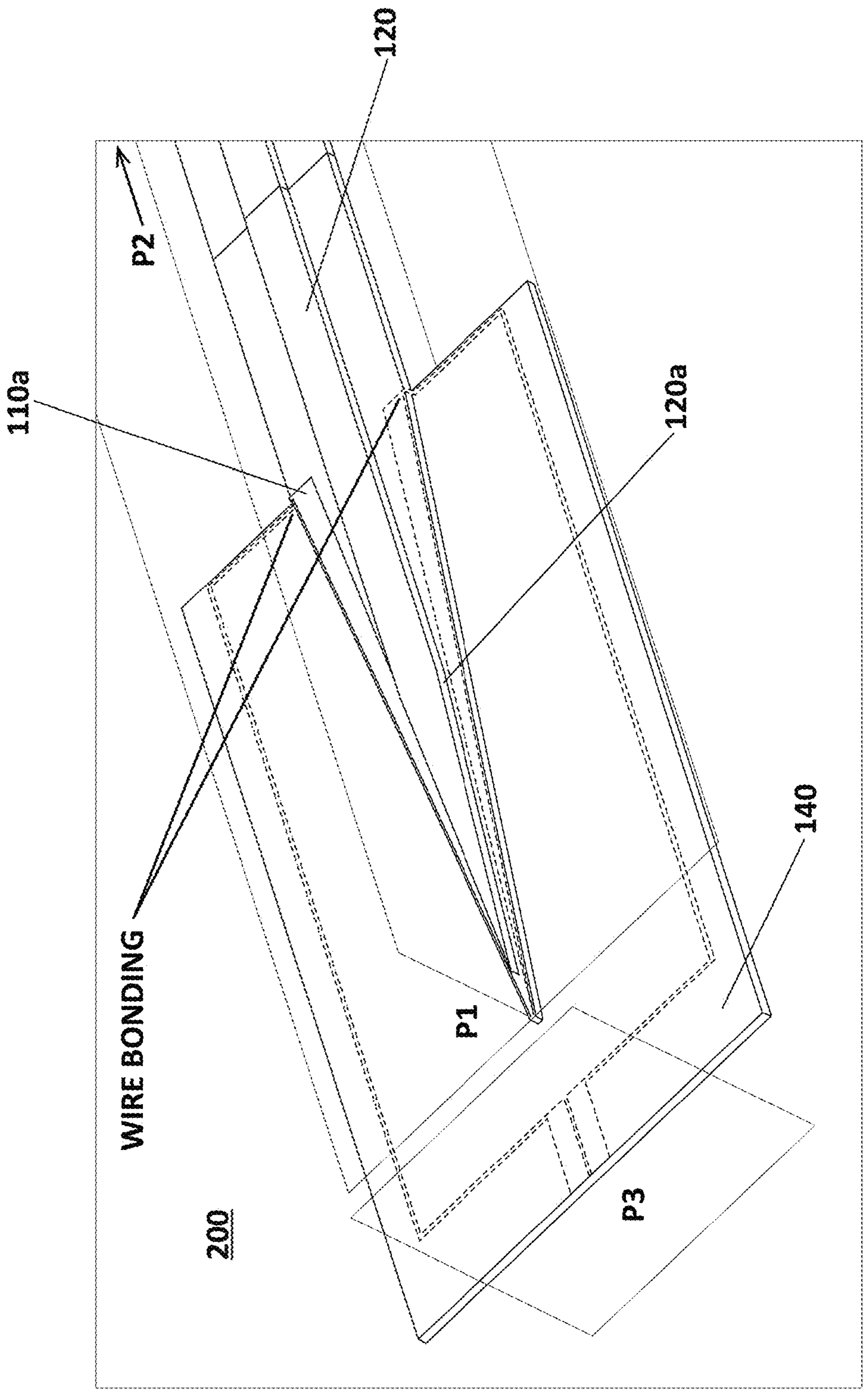
FIG. 13 shows a narrow-baseband access port to the proposed structure.

If DC bias is required for said device, a solution to make the required connections using high impedance lines which provide baseband signal access is shown. The bandwidth of this baseband access can be optimized for direct detection receivers. FIG. 13 uses an additional (preferably low permittivity) microwave substrate (140). The ultra-wideband interconnection probe (200) without bifilar transmission line (110*c*) is shown. The photodiode is illuminated by an optical fiber not shown in the image. Using optical modulation techniques, it is possible to transmit broadband signals with this structure.

Figure 14:
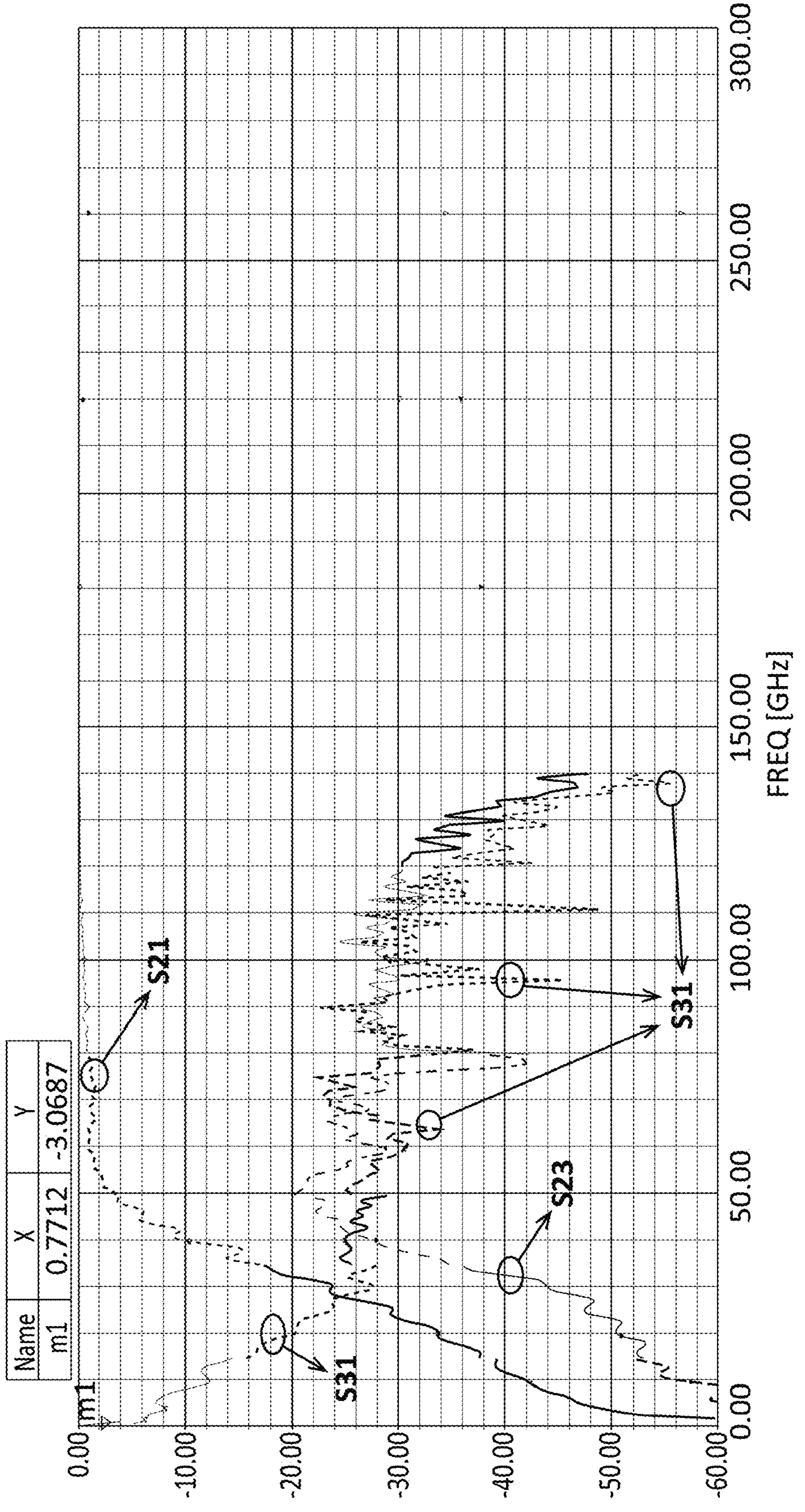
FIG. 14 shows a simulation of the S-parameters of the proposed structure in FIG. 13, between access ports P1, P2 and P3, being P3 a narrow-baseband access port.

FIG. 14 shows a simulation of the S-parameters of the proposed structure in FIG. 13, between access ports P1, P2 and P3, being P3 the narrow-baseband access port. In particular, FIG. 14 shows the amplitude (in dB) of the S parameters obtained from the simulation, wherein S13, S23 and S21 describe the transmission between ports (P1, P2, P3). Transmission between ports (P1) (e.g. a DC supply) and (P3) (a photodiode) occurs (S13=0 dB) in a band from 0 to 600 MHz, which allows to provide the bias of the transmitter device. The radio frequency connection between the transmitter and receiver ports (P3 to P2) through the ultra-wideband interconnection probe (100) occurs for frequencies above 55 GHz (S23 close to 0 dB). Good electrical isolation is achieved between the bias port (P1) and the remote receiver (P2).

When used as a receiver, the ultra-wideband interconnection probes (100, 200) allows to place a Schottky Zero Bias Diode (ZBD) envelope detector or other type of receiver element in (P3). With a Schottky ZBD, the received baseband signals can be detected through the bias connection, with baseband bandwidth from e.g. 0 to 600 MHz.

Figure 15:
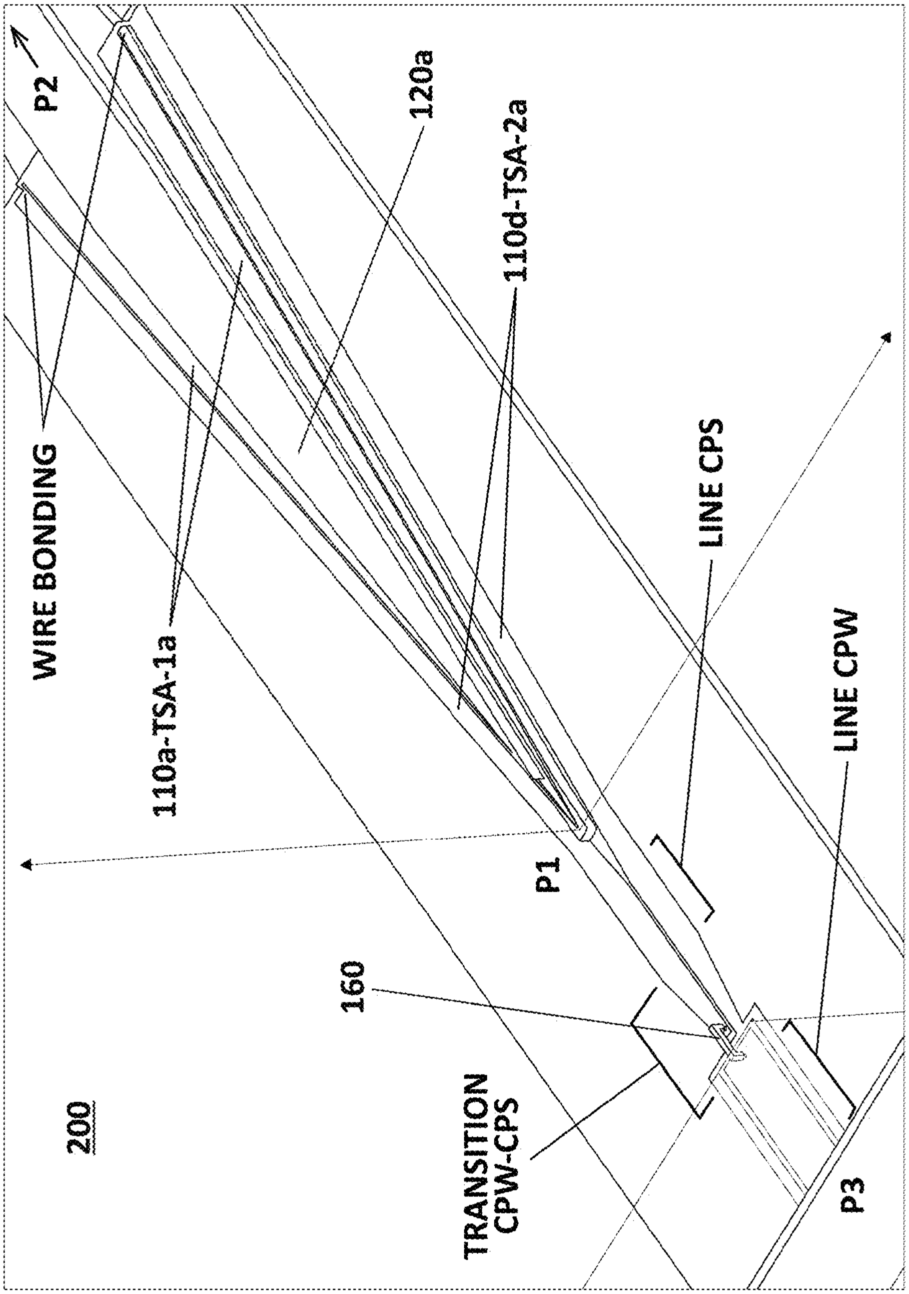
FIG. 15 shows a wide-baseband access port to the proposed structure.

In order to increase said baseband bandwidth in either transmitter or receiver configuration, the ultra-wideband interconnection probe (100) of FIG. 15 is proposed having a wide-baseband access port, where a third metal waveguide pattern (110*d*) defining a third tapered coupler, preferably a an additional TSA antenna (TSA-2*a*) is placed on the microwave substrate (140) surrounding the first tapered end (120*a*) of the dielectric waveguide structure (120) in electrical connection with a first TSA (TSA-1*a*) which guarantees the connection between ports (P1) and (P3) in the low frequencies. The arms of both TSA antennas (TSA-1*a*, TSA-2*a*) are electrically connected at their ends (e.g. through conductive ink, conductive epoxy, wire bonding, or another form that allows an electrical connection between the metallics of different layers). In the realization of the structure shown in FIG. 15, an ultra-broadband CPS-CPW transition operating in a band from 0 Hz to 50 GHz is included. This transition consists of a conducting bridge (160) that joins one of the metals in the CPS line with the conductor central of the CPW line. It is indicated that any waveguide transition between different waveguide structures coupling to the metal waveguide structure (110) can be possible.

Figure 16:
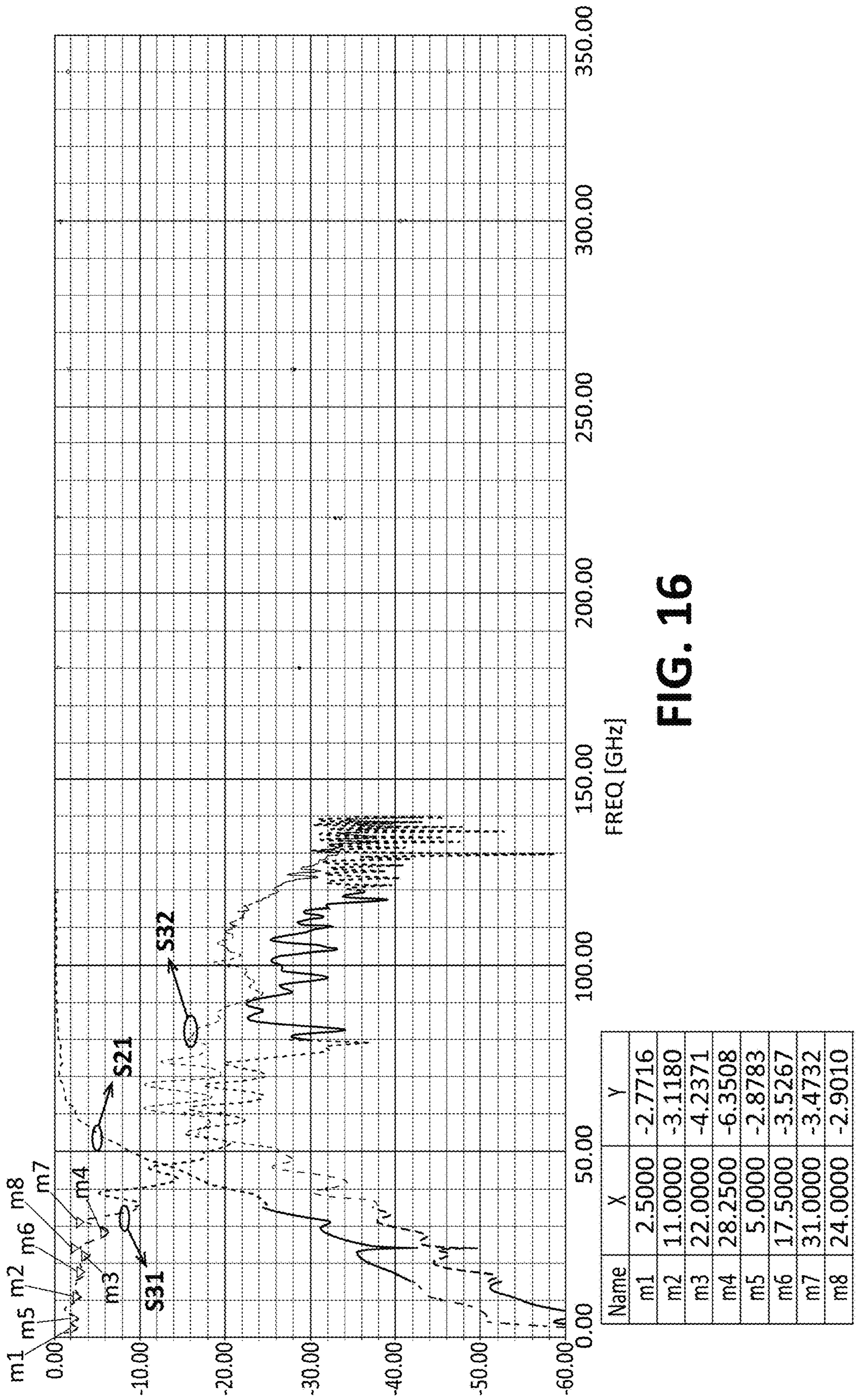
FIG. 16 shows a simulation of S-parameters of the proposed structure in FIG. 15, between access ports P1, P2 and P3, being P3 a wide-baseband access port.

In this design, port (P2) is a source of microwave signals—typically a modulated carrier, thus consisting of a certain bandwidth—that come through the dielectric waveguide structure (120) (or the bifilar line (110*c*)) to the diode located at (P3). The ultra-wideband interconnection probe (100) performs a baseband conversion of the modulated signal. The baseband signal is routed through (TSA-2*a*), the CPS line, the CPS-CPW transition to port (P1). FIG. 16 of S-parameters of the proposed structure in FIG. 15, between access ports P1, P2 and P3, being P3 the wide-baseband access port. For this implementation, a low loss transmission (S23 close to 0 dB) can be seen from the (P2) source to the (P3) diode for frequencies from 60 GHz to, at least, 340 GHz. The diode connection (P3) with the baseband port (P1) (S13) achieves a bandwidth of 24.5 GHz at a level of −6 dB. The isolation between the source and the baseband port (S12) is better than 15 dB in most of the studied frequencies, being better than 10 dB in the frequency range from 60 GHz to 70 GHz.

The invention claimed is:

1. A ultra-wideband interconnection probe (100) connectable to a first access port (P1) of a first electronic device (101), the first access port comprising a first tapered coupler (101*a*) and to a second access port (P2) of a second electronic device (102), the second access port comprising a second tapered coupler (102*a*), the ultra-wideband interconnection probe (100) comprising:

a dielectric waveguide structure (120) establishing a high-pass characteristic interconnect, operating over a high frequency range starting from a low cut-off frequency fCL in the microwave range or in the millimeter-wave range, wherein the dielectric waveguide structure (120) comprises:

a first tapered end (120*a*) connectable to the first access port via the first tapered coupler (101*a*); and a second tapered end (120*b*) connectable to the second access port via the second tapered coupler (102*a*).

2. The ultra-wideband interconnection probe (100) according to claim 1, wherein the dielectric waveguide structure (120) has a rectangular section.

3. The ultra-wideband interconnection probe (100) according to claim 1, further comprising a substrate (140) attached to the dielectric waveguide structure (120).

4. The ultra-wideband interconnection probe (100) according to claim 3, further comprising a metal waveguide structure (110) on the substrate (140), wherein the metal waveguide structure (110) comprises:

a bifilar transmission line (110*c*) with probe tips (110*c*') at both ends that connect to the tapered couplers (101*a*) and (102*a*) and establishes a low-pass filter characteristic interconnect, operating over a low frequency range from DC up to a high cut-off frequency fCH in the millimeter wave range.

5. A ultra-wideband interconnection probe (300) connectable to an access port (P1) of an electronic device (102), the access port comprising a tapered coupler (102*a*), the ultra-wideband interconnection probe (300) comprising:

a dielectric waveguide structure (120) establishing a high-pass characteristic interconnect, operating over a high frequency range starting from a low cut-off frequency fCL in the microwave range or in the millimeter-wave range, wherein the dielectric waveguide structure (120) comprises:

a first tapered end (120*a*); and a second tapered end (120*b*) connectable to the access port of the electronic device via the tapered coupler (102*a*), a substrate (140) attached to the dielectric waveguide structure (120); and a metal waveguide structure (110) on the substrate (140), wherein the metal waveguide structure (110) comprises a metal waveguide pattern (110*a*) defining a tapered coupler, preferably a Tapered Slot Antenna "TSA" (TSA-1*a*) around the first tapered end (120*a*) of the dielectric waveguide structure (120), defining an access port (P).

6. The ultra-wideband interconnection probe (300) according to claim 5, wherein the metal waveguide structure (110) further comprises a bifilar transmission line (110*c*) with probe tips (110*c*') that establishes a low-pass characteristic interconnect, operating over the low frequency range from DC up to fCH in the millimeter wave range.

7. An interconnect system comprising:

a rectangular waveguide; and an ultra-wideband interconnection probe (300) according to claim 5.

8. A ultra-wideband interconnection probe (200) comprising:

a dielectric waveguide structure (120) establishing a high-pass characteristic interconnect, operating over a high frequency range starting from a low cut-off frequency fCL in the microwave range or in the millimeter-wave range, wherein the dielectric waveguide structure (120) comprises:

a first tapered end (120*a*); and a second tapered end (120*b*); and a metal waveguide structure (110) establishing a low-pass characteristic interconnect, operating over a low frequency range from DC up to a high cut-off frequency fCH in the millimeter wave range, wherein the metal waveguide structure (110) comprises:

a first metal waveguide pattern (110*a*) defining a first tapered coupler, preferably a Tapered Slot Antenna "TSA" (TSA-1*a*) around the first tapered end (120*a*); and a second metal waveguide pattern (110*b*) defining a second tapered coupler, preferably a Tapered Slot Antenna "TSA" (TSA-1*b*) around the second tapered end (120*b*); and a substrate (140) connected to the metal waveguide structure (110) and to the dielectric waveguide structure (120).

9. The ultra-wideband interconnection probe (200) according to claim 8, wherein the metal waveguide structure (110) further comprises:

a third metal waveguide pattern (110*d*) defining a third tapered coupler, preferably a Tapered Slot Antenna "TSA" (TSA-2*a*) around the first tapered end (120*a*) for ultra-wide baseband operation, wherein (TSA-1*a*) and (TSA-2*a*) are electrically connected.

10. The ultra-wideband interconnection probe (200) according to claim 8, wherein the metal waveguide structure (110) further comprises a bifilar transmission line (110*c*) with at least two probe tips (110*c*') that establishes a low-pass characteristic interconnect, operating over the low frequency range from DC up to fCH in the millimeter wave range.

11. An antenna having an ultra-wideband interconnection probe (100, 200, 300) according to claim 1.

12. A near-field coupler having an ultra-wideband interconnection probe (100, 200, 300) according to claim 1.

13. A signal transmitter device comprising:

the ultra-wideband interconnection probes (100, 200, 300) according to claim 1; and a transmitter.

14. The signal transmitter device according to claim 13, wherein the transmitter comprises an opto-electronic converter.

15. A signal receiver device comprising:

the ultra-wideband interconnection probes (100, 200, 300) according to claim 1; and a receiver.

16. A signal receiver device according to claim 15, wherein the receiver comprises a Schottky Zero Bias Diode (ZBD) envelope detector.

17. An interconnect system comprising:

a first electronic device (101) comprising a first access port having a first tapered coupler (101*a*);

a second electronic device (102) comprising a second access port having a second tapered coupler (102*a*); and an ultra-wideband interconnection probe (100) according to claim 1.

18. The ultra-wideband interconnection probe (100) according to claim 2, further comprising a substrate (140) attached to the dielectric waveguide structure (120).

19. An interconnect system comprising:

a rectangular waveguide; and an ultra-wideband interconnection probe (300) according to claim 6.

20. The ultra-wideband interconnection probe (200) according to claim 9, wherein the metal waveguide structure (110) further comprises a bifilar transmission line (110*c*) with at least two probe tips (110*c*') that establishes a low-pass characteristic interconnect, operating over the low frequency range from DC up to fCH in the millimeter wave range.

* * * * *